US008829396B2

(12) United States Patent
Rey Garcia et al.

(10) Patent No.: US 8,829,396 B2
(45) Date of Patent: Sep. 9, 2014

(54) FINGER DRIVES FOR IR WAFER PROCESSING EQUIPMENT CONVEYORS AND LATERAL DIFFERENTIAL TEMPERATURE PROFILE METHODS

(75) Inventors: Luis Alejandro Rey Garcia, Long Beach, CA (US); Richard W. Parks, Port Angeles, WA (US); Peter G. Ragay, Anaheim, CA (US)

(73) Assignee: TP Solar, Inc., Paramount, CA (US)

( * ) Notice: Subject to any disclaimer, the term of this patent is extended or adjusted under 35 U.S.C. 154(b) by 429 days.

(21) Appl. No.: 13/303,949

(22) Filed: Nov. 23, 2011

(65) Prior Publication Data

US 2012/0132638 A1  May 31, 2012

Related U.S. Application Data

(60) Provisional application No. 61/443,548, filed on Feb. 16, 2011, provisional application No. 61/418,128, filed on Nov. 30, 2010.

(51) Int. Cl.
*F27D 11/00* (2006.01)
*B65G 17/12* (2006.01)

(Continued)

(52) U.S. Cl.
CPC ............ *B65G 17/12* (2013.01); *F27B 17/0025* (2013.01); *B65G 17/32* (2013.01); *H01L 21/67706* (2013.01); *F27D 3/0084* (2013.01); *B65G 17/26* (2013.01); *H01L 21/67742* (2013.01); *H01L 21/67109* (2013.01)
USPC ........................................ 219/385; 198/339.1

(58) Field of Classification Search
CPC ........ B65G 17/12; B65G 17/26; B65G 17/32; B65G 17/123; H01L 21/67742; H01L 21/67109; H01L 21/67706; F27D 3/0084; F27B 17/0025
USPC ............................... 219/385; 198/339.1, 606
See application file for complete search history.

(56) References Cited

U.S. PATENT DOCUMENTS 2,801,726 A   8/1957   Chew
(Continued)

FOREIGN PATENT DOCUMENTS

CN    1873300        12/2006
DE    202011050472 U1  10/2011
(Continued)

OTHER PUBLICATIONS

20%-Efficient Silicon Solar Cells with Local Contact to the a-Si-Passivated Surfaces by Means of Annealing (COSIMA), Plagwitz, H. et al., Institut fur Solarenergieforschung GmbH, Hameln/Emmerthal (ISFH), Am Ohrberg 1, D-31860, Emmerthal, DE, Proceedings of 20th European Photovoltaic Solar Energy Conference, Barcelonak, Spain, 2005, 4 pages.
(Continued)

*Primary Examiner* — Shawntina Fuqua
(74) *Attorney, Agent, or Firm* — Innovation Law Group, Ltd.; Jacques M. Dulin, Esq.

(57) ABSTRACT

A new class of work-piece conveyors, comprising zero-mass, shadow-less transport systems, with a drive having a pair of parallel, laterally spaced, movable chains defining a processing path, with fingers projecting transversely toward the process path centerline. The gap between fingers eliminates conveyor tube/rod supports, improving wafer quality and conserving energy. Implementations include wire chain, band and roller chain transports to which fingers are secured. Fingers are angled down so that the intersection of the bottom and side edges of the work-piece make only point contacts with each finger. A pair of finger chains implement a single lane drive; adding center bilateral finger drive chains with oppositely pointing fingers implement a multi-lane system. The inventive method includes individually configurable processing temperature profiles in side-by-side lanes, on a zone-by-zone, upper and lower half basis for broad processing flexibility. A novel transducer-based lamp-voltage control system provides stable lamp power for precise temperature control.

25 Claims, 17 Drawing Sheets

(51) Int. Cl.
  *F27B 17/00* (2006.01)
  *H01L 21/677* (2006.01)
  *F27D 3/00* (2006.01)
  *B65G 17/26* (2006.01)
  *H01L 21/67* (2006.01)
  *B65G 47/00* (2006.01)
  *B65G 17/32* (2006.01)

(56) References Cited

U.S. PATENT DOCUMENTS

| | | |
|---|---|---|
| 3,299,196 A | 1/1967 | Lasch et al. |
| 3,828,726 A | 8/1974 | Dietze et al. |
| 4,217,977 A | 8/1980 | Tam |
| 4,354,594 A | 10/1982 | Galloway |
| 4,516,897 A | 5/1985 | Snider et al. |
| 5,011,132 A | 4/1991 | Guttinger et al. |
| 5,088,921 A * | 2/1992 | Csehi et al. .................. 432/121 |
| 5,350,055 A | 9/1994 | Lecrone |
| 5,387,546 A | 2/1995 | Maeda et al. |
| 5,740,314 A | 4/1998 | Grimm |
| 5,820,679 A | 10/1998 | Yokoyama et al. |
| 6,301,434 B1 | 10/2001 | McDiarmid et al. |
| 6,376,804 B1 | 4/2002 | Ranish |
| 6,501,051 B1 * | 12/2002 | Richert et al. ................. 219/388 |
| 6,566,630 B2 | 5/2003 | Kitamura |
| 6,841,006 B2 | 1/2005 | Barnes et al. |
| 7,124,558 B2 | 10/2006 | Weaver et al. |
| 7,514,650 B2 | 4/2009 | Melgaard et al. |
| 7,805,064 B2 | 9/2010 | Ragay et al. |
| 7,915,154 B2 | 3/2011 | Piwczyk |
| 8,039,289 B2 * | 10/2011 | Parks et al. ..................... 438/72 |
| 8,051,629 B2 * | 11/2011 | Pazdernik et al. .............. 53/442 |
| 2010/0220983 A1 | 9/2010 | Doherty et al. |
| 2010/0272544 A1 | 10/2010 | Rivollier et al. |
| 2011/0013892 A1 | 1/2011 | Ragay |
| 2011/0306160 A1 | 12/2011 | Parks et al. |

FOREIGN PATENT DOCUMENTS

| | | |
|---|---|---|
| JP | 2000320977 | * 11/2000 |
| TW | M405428 | 6/2011 |

OTHER PUBLICATIONS

Tecnofimes solid ceramic roller diffusion furnace, www.tecnofimes.con/photovoltaic, May 26, 2010, 2 pgs.

SierraTherm XR Series Roller Hearth Diffusion Furnace, www.sierratherm.com/process-applications/solar-cell, 5 pgs. May 26, 2010.

* cited by examiner

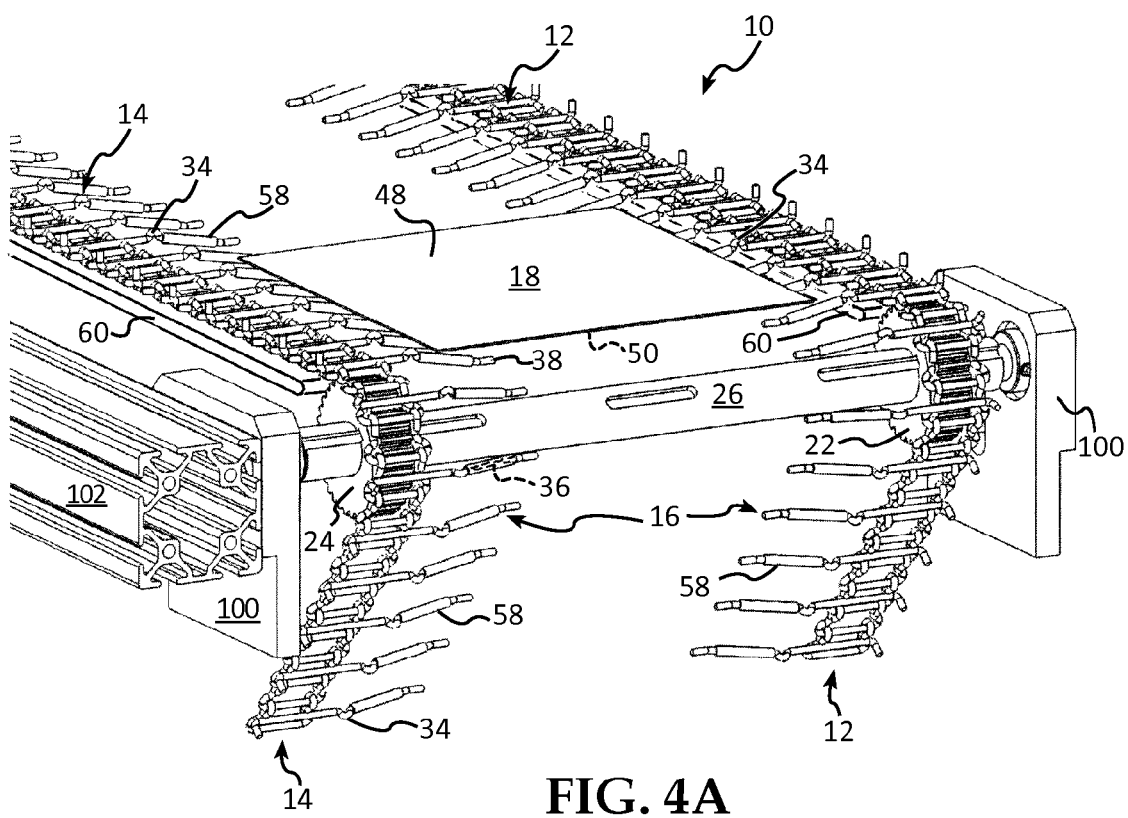
FIG. 4A
FIG. 4B
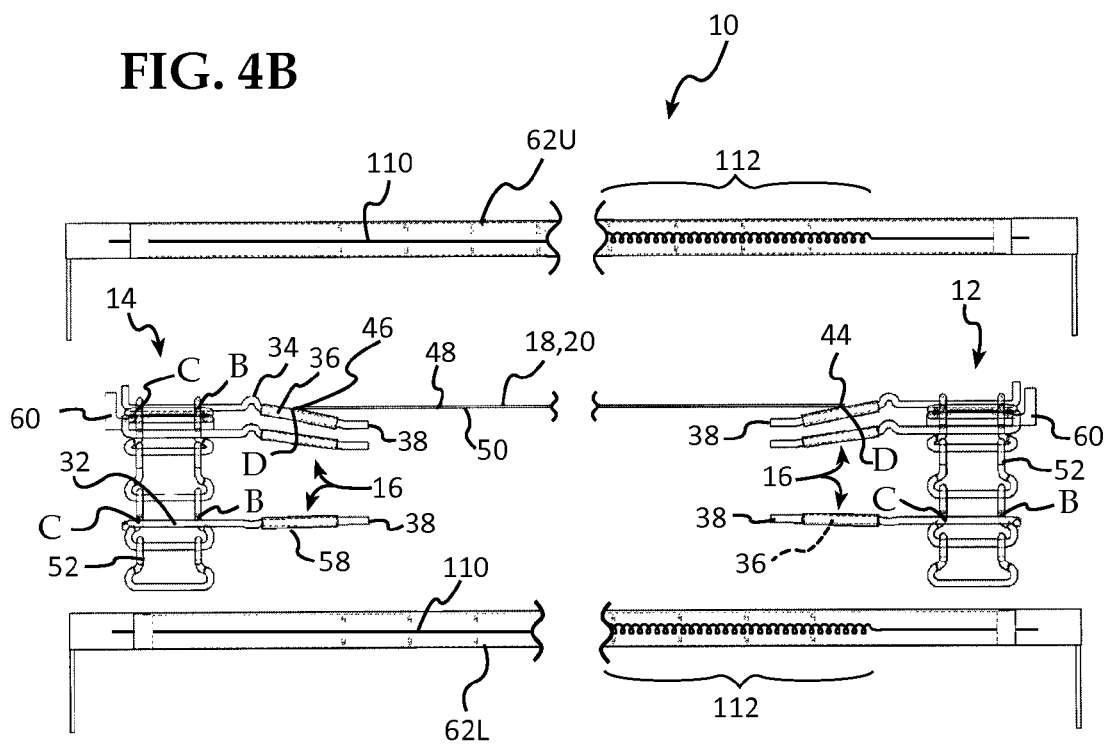

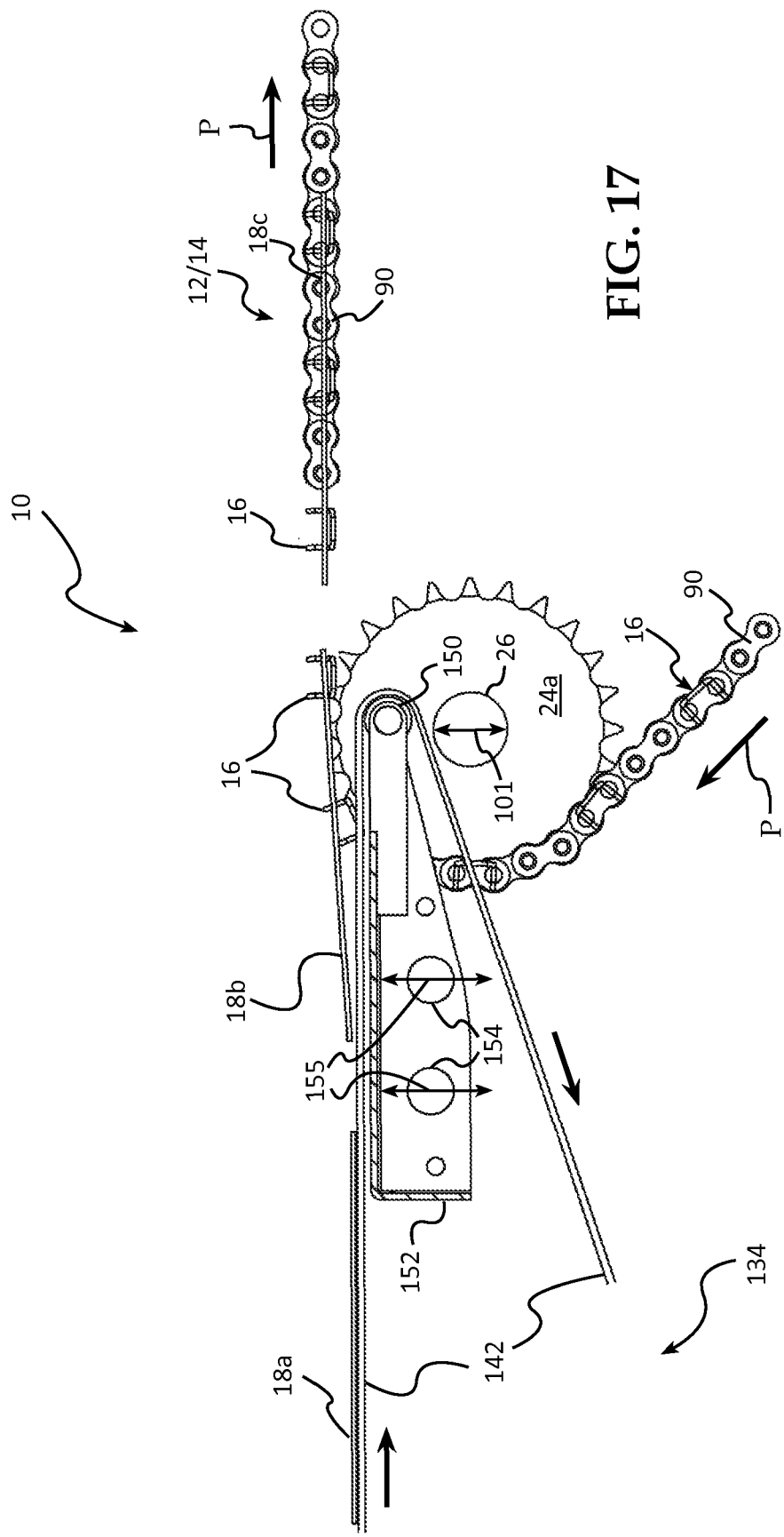

THE INVENTION**

FINGER DRIVES FOR IR WAFER PROCESSING EQUIPMENT CONVEYORS AND LATERAL DIFFERENTIAL TEMPERATURE PROFILE METHODS

CROSS-REFERENCE TO RELATED CASES

This is the Regular US Application corresponding to U.S. Provisional Application Ser. Nos. 61/418,128 filed Nov. 30, 2010 and Ser. No. 61/443,548 filed Feb. 16, 2011, both applications by the same inventors and both entitled Finger Drives for IR Wafer Processing Equipment Conveyors and Lateral Differential Temperature Profile Methods, and the benefits of the filing date of each is hereby claimed under 35 USC 111, 119 or other applicable sections of Title 35 US Code.

FIELD

The invention is directed to a new class of work-piece transfer conveyor systems and methods of operation, and more importantly to transport systems employing finger drives for substantially zero-mass, shadow-less transport of silicon wafers through processing equipment for converting the wafers into solar cells, including UV pre-treaters, dopers, dryers, diffusion furnaces and metallization furnaces. The inventive methods include: lateral differential heating of single lane or multi-lane processing paths to permit configurable, different, unique, lane-by-lane process temperature profiles through all the zones as needed to provide a preselected thermal profile for a particular product being fired in each individual lane; and highly precise furnace temperature control using transducer control of lamp voltage. A transducer-based lamp-voltage control system and method is particularly suited for use with zero-mass transport systems to provide precise temperature control in furnace firing zones.

BACKGROUND

The fabrication of silicon based solar cells requires a number of specialized processes to occur in a specific order. Generally these processes include single crystalline silicon ingots grown in crystal growing furnaces or cast into multi-crystalline blocks in "directional solidification" furnaces. The result of these processes are long "sausage-shaped" single crystal masses called ingots, or multi-crystalline blocks, from which thin slices of silicon are cut transversely with "wire saws" to form rough solar cell wafers. These wafers, whether made up of a single crystal or multiple crystals conjoined together, are then processed to form smooth wafers in the 150 to 330 micrometer range of thickness. Because of the scarcity of suitable silicon, the current trend is towards making the wafers thinner, typically 140-180 micrometers thick.

Finished raw wafers are then processed into functioning solar cells, capable of generating electricity by the photovoltaic effect. Wafer processing starts with various cleaning and etching operations, followed by a 2-stage process called diffusion which creates a semi-conducting "p-n", junction diode, followed by a third process in which "solder paste" coatings of various compositions are screen-printed on the wafer front and back sides and then fired into the p-n junction or back contact layer, where they act as ohmic collectors and grounds, respectively. Typically the back contact surface (ground) is formed from an Al-based paste, and the front surface collector grids are Ag-based paste compositions. Currently is the most common wafers used for forming solar cells are p-type silicon, as n-type is substantially more expensive, although the photovoltaic efficiency is somewhat greater.

The diffusion process broadly comprises two stages: a first stage of applying phosphorous to the top surface of the wafer, e.g., by spraying it with a dilute aqueous solution of phosphoric acid or by placing the wafers in a muffle and exposing them to a vapor of phosphorous oxichloride ($POCl_3$) created by bubbling nitrogen, $N_2$, through liquid $POCL_3$. In the muffle process, the wafers are closely stacked in a carrier and placed in the muffle tube into which the $POCL_3$ is introduced. In the aqueous phosphoric acid process, the doping step occurs in a process zone through which wafers are transported on a conveyor, wherein the surfaces are coated with a phosphoric acid dopant material. Optionally, the doper may include preconditioning one or both wafer surfaces with ozone as an oxidizer. Thereafter the wet acid is dried on the top surface of the wafers.

Boron may also be introduced into the silicon wafer surface, particularly the bottom (back side) surface by application of a boric acid solution followed by diffusion firing. The B-doped wafer surface assists in forming a good ground on the back surface without the need for a back contact Al-based solder layer, thus eliminating that step. Coating both the top surface with a P-dopant composition and the bottom surface with a B-dopant compositions followed by firing in a diffusion furnace is termed "P-B doping" and "Co-Diffusion Firing", respectively.

The second stage of the doping process comprises heating (firing) the coated wafers at high temperatures in a diffusion furnace, chamber, or heating zone, to cause diffusion of the P-based dopant composition into the Si (or other advanced material) top surface of the wafer substrate to form the p-n junction layer, or/and diffusion of the B-based dopant composition into the bottom surface of the wafer surface to form a ground (back contact) layer. The P or/and B is driven into the wafer by the high temperature diffusion firing. Current diffusion firing processes move the wafers slowly through the furnace, the transit time being in the range of 20-30 minutes. The P-doped Si forms the "emitter" layer of the photovoltaic cell, that is, the layer that emits electrons upon exposure to sunlight (the normal photon source). After diffusion firing, the wafer resistivity is measured in an array of spaced points on the top surface, with the higher the resistance value, in Ohms, the better the photovoltaic response of the final solar cell.

The following is a summary of subsequent steps of processing diffusion-fired wafers and some significant problems of the present art, which puts the invention into more complete context.

After diffusion and various cleaning, laser edge ablation, and etching processes to remove unwanted semi-conductor junctions from the sides of the wafers, the wafers are coated with an Anti-Reflective Coating (ARC), typically silicon nitride ($SiN_3$), generally by plasma-enhanced chemical vapor deposition (PECVD). Between some of these processes, the wafers are dried in preparation for subsequent processes in low temperature drying ovens.

The $SiN_3$ ARC is deposited to a thickness of approximately ¼ the wavelength of light of 0.6 microns. After ARC application, the cells exhibit a deep blue surface color (or brown color, depending on the coating material used). The ARC minimizes the reflection of incident photons having wavelengths around 0.6 microns. The ARC $SiN_x$ coating is created in the PECVD process by mixing silane, $SiH_4$, ammonia, $NH_3$, and pure nitrogen, $N_2$, gases in various concentrations in a high or low frequency microwave field. The hydrogen dissociates and diffuses very rapidly into the silicon wafer.

The hydrogen has a serendipitous effect of repairing bulk defects, especially in multi-crystalline material. The defects are traps where electron-hole pairs can recombine thereby reducing cell efficiency or power output.

As noted above, where a back contact layer is used for ground, the back surface typically is fully covered by an Al-based paste. The front or top surface is screen printed with a fine network of Ag-based paste lines connected to larger buss conductors to "collect" the electrons generated, either within the depleted region of the underlying P-doped Si emitter, or near the surface. At the same time, the highest possible open area is left uncovered for the conversion of light into electricity.

After these pastes have been dried, they are "co-fired" at high temperature in an IR lamp-heated conveyor-type metallization furnace. The back surface Al-paste melts into a uniform back contact grounding layer, while the front surface paste lines are sintered to form smooth, low-ohmic resistance conductors (lines and busses) on the front surface of the solar cell. During this IR-heated metallization firing, elevated temperatures (above 850° C.) will cause the hydrogen to diffuse back out of the wafer. Thus, short firing times are necessary to prevent this hydrogen from 'out-gassing' from the wafer. It is best that this hydrogen is captured and retained within the bulk material (especially in the case of multi-crystalline material).

Currently available IR conveyor furnaces for such diffusion firing processes have a long heating chamber in which a plurality of IR lamps are substantially evenly spaced apart (on the order of 1.5" apart) both above and below the wafer transport system (wire mesh belt or ceramic roller conveyor). The heating zone is insulated from the outside environment with various forms of insulation, compressed insulating fiber board being the most common. The infra-red (IR) lamps increase the temperature of the incoming silicon wafers to approximately 700° C. to 950° C. This temperature is held for the 30-minute duration of the diffusion process, after which the wafers are cooled and transferred to the next downstream process operation and equipment.

Currently available conveyor-type liquid dopers (as distinct from the muffle tube and carrier-type POCl3 gas dopers) employ paper or elastomeric band conveyors on which the wafers travel. In the case of paper transfer systems, wafers rest on a disposable paper conveyor belt to protect the back side of the wafer from exposure to the doping chemicals. This method requires time-consuming extra steps of mounting rolls of wafer carrier paper at the inlet end, and separation, collection and disposal of the used paper at the outlet end.

Currently available diffusion furnaces typically employ one of two types of wafer transport systems: 1) a plurality of static (not-longitudinally moving), solid ceramic, rotating rollers; or 2) active (longitudinally moving) metal wire mesh belts, to convey the wafers through the furnace firing zone. Static, ceramic rotating-roller furnaces currently are preferred in order to minimize or prevent metallic contamination of the back surface of the wafers as occurs with metal mesh belts, by metal or metal ions evaporating off the wire mesh during processing. Ceramic roller furnaces are not used in metallization firing.

A typical conventional diffusion furnace is on the order of 400" long, having 160, 36"-wide IR lamps placed above the rollers, with from 100-160 placed below. The total mass of the conveyor rollers is on the order of 800 lbs, and is classified as a high-mass conveyor system.

In such high-mass, static, solid, rotating roller conveyor furnaces, the IR lamps take substantial time to bring the furnace chamber up to diffusion temperature in the range of 700° C. to 950° C. The theory of operation apparently is that the heated roller mass helps keep the furnace at a more even temperature throughout, as a result of the thermal reserve provided by a large, hot mass having a substantial heat capacity. Such furnace systems are touted as being able to compensate, in the short term, for failure of one or several IR lamps, if spread throughout the furnace, since the hot rollers continue to provide heat to the wafers via contact conduction and hot air convection. The IR lamps below the rollers maintain the rollers hot, and the contact of the wafers with the rollers helps transfer heat to the wafers by thermal contact conduction. Since the rollers at the entrance and exit are not heated by the same number of lamps as those in the center of the furnace, the furnace has a pronounced longitudinal thermal profile, rising at the entrance and descending at the exit.

As the demand for solar cells increases, the rates of production must increase, either by process improvements or adding furnaces into service. With respect to adding furnaces, conventional furnaces have a large footprint and the diffusion process is very slow. In large part, because of the mass of ceramic in the furnace that provides thermal energy, the IR lamps are run at from about 15-20% of maximum power. Running them at greater power levels would easily raise the temperature higher than needed for diffusion, and approach failure of metallic components (e.g., in the roller drive elements secured to the ends of the rollers). Accordingly, the "soak" period to accomplish diffusion is long—on the order of 20-30 minutes. Thus, since the furnaces are large, adding furnaces requires increased capital outlay, for buildings, the furnaces themselves, and related service facilities. The great mass of the conveyors requires high energy input. In addition, there is a long heat-up stage at start-up, and likewise a long cool-down stage in order to be able to service the furnace, which cannot be done when hot. Both result in process inefficiencies and waste of energy.

In the case of wire mesh belts used in the metallization furnaces, the mesh belts must be supported beneath the belts to prevent sagging. These supports are provided as pairs of opaque, white quartz tubes or rods, typically on the order of 2-3 cm in diameter, placed with their long axes parallel-to or slightly canted to the direction of travel of the belt, e.g. in a staggered converging or diverging (herringbone) pattern. The quartz tubes are smooth, and provide line contact surfaces on which the underside of the conveyor belt slides as it transports the printed wafers through the metallization furnace processing zones. However, the presence of the belt support tubes or rods significantly shadow the underside of the wafers, so that there is uneven distribution of IR radiant heating energy on the backside of the wafers. The back surface ground contact layer paste flow can be adversely affected, and a "shadow" of the support tubes is imprinted into the wafer, adversely affecting its performance. This was particularly adverse where the tubes were spaced apart along each side of the conveyor belt travel centerline and parallel to it. Accordingly, the practice for over 10 years has been to angle the tubes, either converging or diverging along the line of travel so that the same portion of the wafer was not shadowed the entire duration of travel through the furnace. The shadow effect is reduced by this trick of angling the support tubes, but not eliminated, because now the entire wafer is in shadow at least some of the duration of transport through the furnace. In effect, the shadow lines are there, less pronounced and more diffuse, but broader.

In addition to a shadowing effect, the presence of quartz tube or rod belt supports presents an energy inefficiency in two respects: First, the energy cost to heat the belt and supports, and second, the additional energy cost required to overcome shadowing by the belt (which is minor for the wire mesh belts themselves) and the quartz tube or rod supports (substantial). In addition, wide metal belts and quartz supports are expensive to fabricate (materials and manufacturing costs) and to maintain (repair and replacement). The belts and quartz tube or rod supports are expensive to ship and handle during installation.

In addition, the need to cool the mass of the wire mesh belt requires, in current commercially available metallization furnaces, a long cooling section having water cooled heat transfer units located under the belt between the peak zone and the output transfer belt. The conveyor cannot be returned to the cold, input end, as thermal shock of a wafer contacting a hot belt can damage wafers. These zones and the heat exchange tubing modules are on the order of 6-10' in length, extend the footprint of the furnace, are expensive to manufacture, and require energy to pump the water. In addition, since most such systems have once-through cooling, a lot of water is wasted.

With respect to furnace interior access, provided for service and maintenance only when the furnace is OFF and cold, two main systems are currently commercially available. The oldest system, dating from around 2001 is a 4-poster Top-Lift, UP Access system used by RTC Corporation and TP Solar, Inc in their furnaces and dryers (Richert U.S. Pat. No. 6,501,051, Csehi U.S. Pat. No. 5,088,921, Ragay U.S. Pat. No. 7,805,064 and Parks U.S. Pat. No. 8,039,289). In such systems, the upper half portion of the heating zone is lifted by four corner jacks above the conveyor belt and fixed-position lower half of the furnace. This provides worker-standing-height access to the upper portion for service of the upper lamps while the belt remains completely supported by its support tubes. However, the belt and its supports block access to the lower half. In contrast, Despatch Industries uses a relatively new and very different system, commercially dating from 2006, in which the bottom half portion of the heating zone drops in a Bottom-Drop, DOWN Access system (Melgaard U.S. Pat. No. 7,514,650). The arrangement of the jacks is different and the result is different than in UP Access systems, in that when the bottom portion is dropped, the conveyor belt is suspended in mid-air blocking access to the fixed-position upper half, and access for kneeling workers to the lower half is possible after removal of the conveyor support rods. Where a considerable number of wafers are broken during processing in the Despatch furnaces, access to the bottom half of the furnace may be considered a benefit.

Thus, the need for faster production and greater throughput, while curbing facility capital outlay, is not met by the current state of the art solid, rotating ceramic roller conveyor furnaces or by quartz-tube/rod-supported metal-mesh belts. In order to compensate, conveyor-type furnaces have been made laterally wider, so that multiple lines of wafers can be processed in each process zone. This in turn requires longer, more expensive lamps which typically experience a substantially shorter mean time to failure, thus significantly increasing operating costs.

Since there are dimensional and IR lamp cost constraints, increasing lamp density in the furnace is not generally a feasible solution. Likewise, increasing the power to the lamps to boost output is not currently feasible because higher output can result in overheating of the lamp elements, as a result of the thermal mass of the furnace, principally in the high mass solid ceramic roller conveyor system. Overheating particularly affects the external quartz tubes of the lamps. Currently, commercially available metallization furnaces are thermocouple controlled. Since the IR lamps are placed side by side, on the order of 1.5" apart, each lamp heats lamps adjacent to it. When the thermocouples detect temperatures approaching the selected diffusion or sintering temperature set point in the 700-950° C. range, they automatically cut back power to the lamps by an amount that depends on the thermal mass of the transport system (rollers or metal mesh belts and quartz tube supports). This lower power density is accompanied by substantial changes in the spectral output of the IR lamp emissions (hence a lower light flux and energy output). In turn, this reduced light flux results in the need to slow down the conveyor belt speed or lengthen the furnace (while maintaining the original belt speed), thus slowing processing. Overheating of lamps, e.g., due to thermocouple delay or failure, can cause the lamps to deform, sag and eventually fail. Lamp deformation also affects uniformity of IR output delivered to the wafers.

Finally, there is a severe problem in many countries with mains power fluctuation. Mains power is normally provided at 480 volts, and this is cut to the 225 volt level for supply to the furnace lamps by SCR voltage controllers. However, the Mains voltage typically fluctuates on the order of ±5-15% (25-75 volts), and is "noisy". Where the fluctuation is that large, the voltage to the lamps can vary on the order of 20-35 volts. And the noise can cause the SCR to fire erratically. The result is significant errors in control of the furnace temperature, particularly as the thermocouples are relatively slow to respond. Since the transit time of wafers through the peak firing zone is on the order of 5-10 seconds, this fluctuation and noise-induced loss of control can result in a substantial number of wafers not being processed at the precise peak temperature needed to properly fuse the Ag-based paste into the n-p junction layer. The result is that in many wafers, the collector grid lines never penetrate the ARC layer into the junction layer, or burn all the way through it, shorting the wafer to ground.

Accordingly, there is a serious and substantial unmet need in the diffusion and metallization furnace and firing process art to significantly improve net effective use of firing zone(s) by reduction in conveyor mass (including supports), thereby providing better control and thermal profiles throughout the entire furnace, permitting improved utilization of firing energy, improving the speed and uniformity of the diffusion process, reducing furnace size by reducing or eliminating cooling zones, while retaining or improving throughput, and accomplishing these goals on a reduced furnace footprint, and lower energy, operating and maintenance costs.

THE INVENTION

Summary, Including Objects and Advantages

The inventive new class of work-piece transfer conveyors employing substantially zero-mass, shadow-less transport finger drives are particularly useful for IR lamp-heated processing furnaces in which work-pieces are moved longitudinally along a processing path on a moving conveyor. The inventive drives comprise single or multi-link chains having thin, single or double wire fingers (also called "digits") extending laterally therefrom that are configured to provide edge support for the work-pieces. Spaced pairs of chains are aligned in parallel and synchronously move parallel to the horizontal longitudinal centerline of the processing zone. The longitudinal centerlines of the processing zone and finger drive are congruent. The chains are spaced apart a sufficient width so that the opposed chain fingers support corresponding opposite side edges of a work-piece as it is transported through one or more processing zone(s). In the exemplary implementation described herein, the work-pieces are thin silicon n- or p-type wafers transported through the several processing zones during their conversion to solar cells, e.g., UV pre-treating, doping, drying, diffusion firing, cooling, and metallization firing. However, the inventive finger drives may be used to transport any thin work-piece that requires minimal contact with one or both face surfaces.

In the method aspects of the invention, differential heating of side-by-side lanes, or lateral differential heating across a land (orthogonal to the processing path direction of travel of the work-piece) is implemented, by way of example, by IR heating lamp distribution, by IR heating lamp design, by power control of the IR lamps and/or by independent control of conveyor rate of travel in each of side-by-side processing lanes, each having an independent conveyor. The inventive methods include differential heating of single lane or multi-lane processing paths to permit configurable, different, unique, lane-by-lane process longitudinal or/and lateral temperature profiles through all the zones as needed to provide a preselected thermal profile for a particular produce being fired in each individual lane. In addition, a transducer-based lamp-voltage control system and method is particularly suited for use with zero-mass transport systems to provide precise temperature control in furnace firing zones.

In a two lane processing furnace having a common transport system, the lanes are laid out in parallel side-by-side orientation, with one designated as Lane A and the adjacent one designated as Lane B. Each lane has an individual outside chain, with a third, common center chain having fingers extending on both sides to serve both Lanes. In this system the conveyor(s) transport rate is the same in both Lanes, in which case differential Lane thermal profiles are controlled by lay-out and configuration of lamps in each of the several zones, and selectable control of power to each lamp or group of lamps.

In the alternative, each lane has its own, separate, transport drive system, each of which is independently controllable for transport speed. The number or spacing of lamps in Lane A zones may be different than the number in Lane B. Or, where the number of lamps is the same in both Lanes, the power provided to lamps in one lane may be different than the other, on a zone by zone basis. Each zone of each Lane is individually and independently selectably configurable as needed to provide a unique thermal profile along the entire longitudinal processing path for a particular product being treated or processed (e.g., fired). The furnace includes a programmable computer control system that includes preselected or configurable thermal profiles for precise temperature gradients on a lane-by-lane, zone-by-zone, upper and lower furnace halves basis, for the full length of the processing path. A fill-in template system is preferably used for configuring each lane independently, or identically, to the other. In a single lane furnace, one side of the lane may be controlled to have a different thermal profile than the other side, so that there is differential thermal profile laterally (transversely) across the lane.

In the case of a single line or Lane, that is a processing line for a single file of wafers, two spaced drive chains are used, a right side chain and a left side chain, as seen in end elevation. The fingers of the right side chain extend to the left toward the processing zone centerline, and the fingers of the left side chain extend to the right toward the processing zone center line. However, there is a wide transverse gap between the tips of the respective right and left fingers; the fingers do not join or contact each other across the width of the lane.

The wafers are only edge-supported during their transport through the equipment, e.g., furnace or dryer. In addition, there are no tube or rod supports located in the gap between the opposed, spaced sides, finger drives of the transport system. The wafers appear to float along the process path. It is an important feature of the invention that as a result of the combination of the gap and absence of tube/rod supports between the side drives, there is access provided into the lower heating zone of the furnace or dryer in both a Top-Lift, UP Access type furnace or dryer (such as shown in Richert U.S. Pat. No. 6,501,051, Ceshi U.S. Pat. No. 5,088,921, Ragay U.S. Pat. No. 7,805,064, Ragay 2011/0013892 A1, and Parks U.S. Pat. No. 8,039,289), or in a Bottom-Drop, DOWN Access type furnace or dryer (see Melgaard U.S. Pat. No. 7,514,650). Thus, whereas in the prior art, the full-width wire mesh conveyor blocked either the lower or upper portion of the heating zone when the furnace or dryer is opened, in the inventive transport system, there is no full-width conveyor belt blockage, so that on relative motion of the furnace heating zone upper and lower portions, whether UP Access or DOWN Access, there is provided full access to both upper and lower heating zone portions simultaneously. This "full access" feature would also be present with the inventive transport system mounted in any furnace having upper and lower heating zone portions that are configured to raise the upper portion, in dual opening (both upper and lower portions are moved) and in clam-shell-type opening furnaces and dryers (top lifts from only back longitudinal side).

The two spaced drive chains are driven and guided by common shafts having a right side drive gear or idler sprocket engaging the right side chain and a left side drive gear or idler sprocket engaging the right side chain. The lateral fingers are secured on or to the chain links so as to not be interfered with by the gear/sprocket teeth, or the fingers may be inserted in, extensions of, or secured to, pivot pins or tubes of the links.

In the case of a two line drive, where pairs of wafers advance through the processing zones in a side-by-side relationship, three chains may be used: a left, a center and a right side chain. The left and right are as above described. The center chain includes fingers projecting laterally on each side of the chain, both to the left and to the right. The fingers on the center chain may be aligned or staggered, alternating left and right respectively. It is not required that fingers on each pair of spaced side drive chains are aligned or coordinate. That is, the fingers supporting the left edge of a wafer need not be transversely in line with the fingers on the opposed belt supporting the right edge of the wafer.

The opposed fingers on the two chains may be aligned or staggered. Thus, the fingers on the right chain may be secured to odd numbered links 1, 3, 5, etc, while the fingers on the left chain may be coordinate, that is, secured to the corresponding same odd numbered links, or may be staggered with respect to the right chain, secured to even numbered links 2, 4, 6, etc. In exemplary implementations, the fingers are spaced apart with respect to the work-piece being transported so that there are two or more fingers supporting each work-piece side edge. In the case of a 6" silicon wafer, 3 or 4 fingers support each edge of the wafer so that it is transported stable and level through the process zones. For example, the chain links are on the order of 2-4 cm in length and the fingers are spaced similarly.

The fingers may take a wide range of configurations. In the exemplary presently preferred embodiment disclosed herein, the fingers are angled downwardly on the order of from about 3° to about 45°, preferably about 5°-20° so that the bottom corner of the wafer edge contacts the upper edge of the fingers in point contact. Where the fingers are round or triangular (with the point upward) in cross section, e.g., wires, the wafers are supported by minimal point contact. Optionally, to assist in preventing the wafers from falling off, e.g., in the case of an updraft, the outermost end of the finger wire is bent more nearly horizontal. Preferably, an upward-pointing ear is formed into the wire adjacent the side edge of the chain link to prevent the wafer from sliding up into contact with the chain.

The fingers may be single or double digit, the single fingers giving the appearance of thin legs, hence the informal name "millipede" chain, while the double digits give the appearance of wider legs, hence the informal name "caterpillar" chain. The double fingers have the benefit of not rotating in the chain sleeves in which they are received. The double finger shanks are received in adjacent link sleeves, followed by a finger-less link. Thus, an exemplary implementation of the double finger caterpillar chain is configured with alternating links along the chain removably receiving double fingers fitted in the roller sleeves. In the case of a single center chain used in a dual lane furnace configuration, each link receives a double finger, with alternating double fingers pointing right and left, respectively. The side-by-side double fingers are oriented pointing orthogonal (transverse) to the longitudinal direction of the chain and joined with a longitudinal cross bar at their tips. In a preferred embodiment, the double fingers are generally U-shaped or Π-shaped (the Greek Capital Letter Pi) when seen in plan view, but may also be V-shaped, that is, the two fingers converge at a common tip. Another suitable configuration is H-shaped, X-shaped, or free form, such as ∩-shaped, again, as seen in plan view.

In the currently available solar cell processing furnaces and dryers, the heating is done by the use of high intensity IR lamps placed both above and below the process zone centerline. In marked contrast to currently available furnace conveyor systems, it will be evident to one skilled in this art that the inventive finger drive transport systems are near-zero mass. There are no full width transverse wire mesh conveyor belt and longitudinal tube/rod supports, or full width transverse rollers obstructing the IR lamp light flux impinging on the bottom of the wafers. In the case of conventional wire mesh belts, for example in metallization furnaces, a complex series of converging or diverging (herring-bone) quartz tubes/rods are used to support the center section of the belt so that it does not sag. These quartz tubes/rods shadow the underside of the wafers, and adversely affect the performance of the solar cells. In addition, the quartz tubes/rods are an added cost in construction, require precise support and vertical alignment, and are equally costly to replace and service. In contrast, the inventive finger drive wafer transport system is shadow-less (shadow free), there being no mesh belt or support tubes to mask the underside of the wafers.

As a result of the shadow free feature, use of the inventive transport permits processing to be faster, the energy required to be lower, and/or the furnaces made shorter in length, as all of the IR flux is more efficiently delivered to the underside of the wafers, evenly and continuously throughout all process zones. In addition, it is possible to reduce or entirely eliminate the copper tube water cooling zone of a metallization furnace, typically 6-10' in length, as there is no full width conveyor mass to cool in the inventive transport system.

In another important embodiment, in the case of doping operations and diffusion furnaces where metal mesh belts are not used due to contamination of the wafers by the metal belts in contact with the underside of the wafers, the inventive finger drive fingers should be passivated. The passivation may be implemented by titanium nitride coating the finger wires for use in doper apparatus, or fitted with small ceramic tubes slipped over the fingers in the case of diffusion furnace use. The edges of the wafers contact the ceramic tubes rather than the wire of the fingers, thereby eliminating a source of contamination. In another alternate embodiment, metal fingers may be replaced with ceramic fingers secured to the chains, e.g. via a shank that slips into the sleeve of a roller chain link. In still another embodiment, the fingers may be coated with glass, of the type formulated to bond with metal, such as radio tube glass. In the alternative, the fingers may be coated with a formulation of powdered glass or ceramic plus a binder, and then fired to form a glass or ceramic frit-type coating. In another alternative, the finger wire support section or/and tip may be coated with a ceramic engobe composition.

For UV pre-treatment and doper processing operations (orthophosphoric and/or boric acid coating followed by drying), a presently preferred finger material is stainless steel wire that is titanium coated and then nitrided to form a TiN coating, which is resistant to the acid used in the P or B doping composition.

With respect to the method aspects of the invention, the inventive method comprises transporting wafers through at least one processing zone by only plural point contact of opposed wafer edges, while the bottom surface of the wafer is shadow free, essentially unobstructed from exposure, e.g., exposure to IR radiant flux during transport. The inventive method comprises shadow free, mass-less "floating" transport of the wafers through one or more processing zones, this step including guiding work-piece wafers in a linear path by edge point contact of the wafers with a transport having a drive system including longitudinally spaced apart work-piece edge-engaging means, preferably members such as fingers, projecting laterally from the conveyance means, which contact and support opposed side edges of each work-piece wafer at least two spaced points. The method is universal, being applicable to a single line processing of one or more sizes of work-piece wafers simultaneously, or plural lines of work-pieces being transported in side-by-side relationship by three or more appropriately laterally-spaced transport drive systems.

In a second embodiment of the method applied to furnace processing, the IR lamps are configured and controlled to provide differential lateral heating top vs bottom, or across the processing path, or in different lanes, so that the work-pieces are differentially heated, more or less on one face (or side of an individual face) than the other, as they traverse through the processing zone(s). In the case of multiple side-by-side lanes, the lamps can be controlled to provide more heating (of an individual face of a work-piece) in one lane than the other. The inventive differential lateral heating may be implemented in the case of IR lamp furnaces in a variety of manners, e.g., by transversely oriented IR lamps having heavier or multiple filaments on one side than the other, by additional lamps added to one side of the transport path, by shielding or partial shielding one side of transversely oriented IR lamps, and by processing zone(s) in which IR lamps are oriented parallel to the transport path with more lamps on the side to be heated hotter than on the cool side, and by selective control of power to each lamp, or bank of lamps in a zone, individually.

The invention also includes an improved transducer-based lamp voltage control system and method for fast control of voltage delivered to the lamps during operation, resulting in more precise and stable firing zone temperature, in spite of Mains power fluctuations, load variation in the furnace, or furnace internal environment upsets or transients. This inventive lamp voltage control is particularly suited to a finger drive transport system as it has no substantial conveyor mass to assist in dampening thermal transients. The inventive fast lamp voltage control method also cross-checks against firing zone thermocouple readings and set point to verify and adjust, as needed, the lamp voltage set point for continued transducer-control lamp voltage operation.

Transfer conveyor belts are provided at the input and output of the inventive finger drive transfer systems, which are narrower in width than the gap between the inner terminations of the fingers, and narrower than the width of the wafers being transferred onto the finger drive. The transfer belts project into the path of the finger drive so that at the input end, the fingers rise and gently lift the wafers off the transfer conveyor belt, and conversely lower to gently place the output wafers onto the output transfer conveyor belt. To assist in "tuning" the transfer to and from the finger drive, the inner end of the transfer conveyor belts may be adjusted longitudinally to project more or less into the gap, and may also include means for vertical adjustment. Thus, position tuning in longitudinal and vertical directions results in gentle lifting and placing of wafers during transfer does not result in shock or breakage of the wafers. Optionally, the finger drive may be vertically adjustable.

It will be evident to one skilled in this art that a wide range of finger designs and processing methods may be employed while keeping within the scope of the principles of this invention. The transport system and methods of the invention also result in the back contact layer being fired more uniformly, and there are substantially lower maintenance costs afforded by the simpler side chains or belts of the transport drives and there is no paste left on the belts that needs to be cleaned off.

BRIEF DESCRIPTION OF THE DRAWINGS

The invention is described in more detail with reference to the drawings, in which:

FIGS. 4A and B are front isometric and elevation views, respectively, looking down the processing zone(s) path, the drive fingers in this second embodiment carrying protective ceramic tubular sleeves, FIG. 4A showing sleeves in dashed lines projecting below the wafers, and FIG. 4B showing stubby fingers for a dedicated drive and slider bars under the side transport chains;

FIG. 8B is an isometric view of the center, opposite facing double finger center transport chain apparatus showing staggered opposing fingers, and FIG. 8c is an isometric opposite facing double finger center transport chain in which a single wire across the chain forms both fingers (not staggered);

FIG. 17 is a side elevation view, taken along the centerline of the furnace, showing the fingers of the furnace transport conveyor lifting wafers off an input transfer conveyor;

DETAILED DESCRIPTION OF EXEMPLARY IMPLEMENTATIONS OF THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including what is presently believed to be the best modes of carrying out the invention and its use in transport methods.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. Thus, the best mode embodiment of one feature may be shown in one drawing, and the best mode of another feature will be called out in another drawing.

Figure 1:
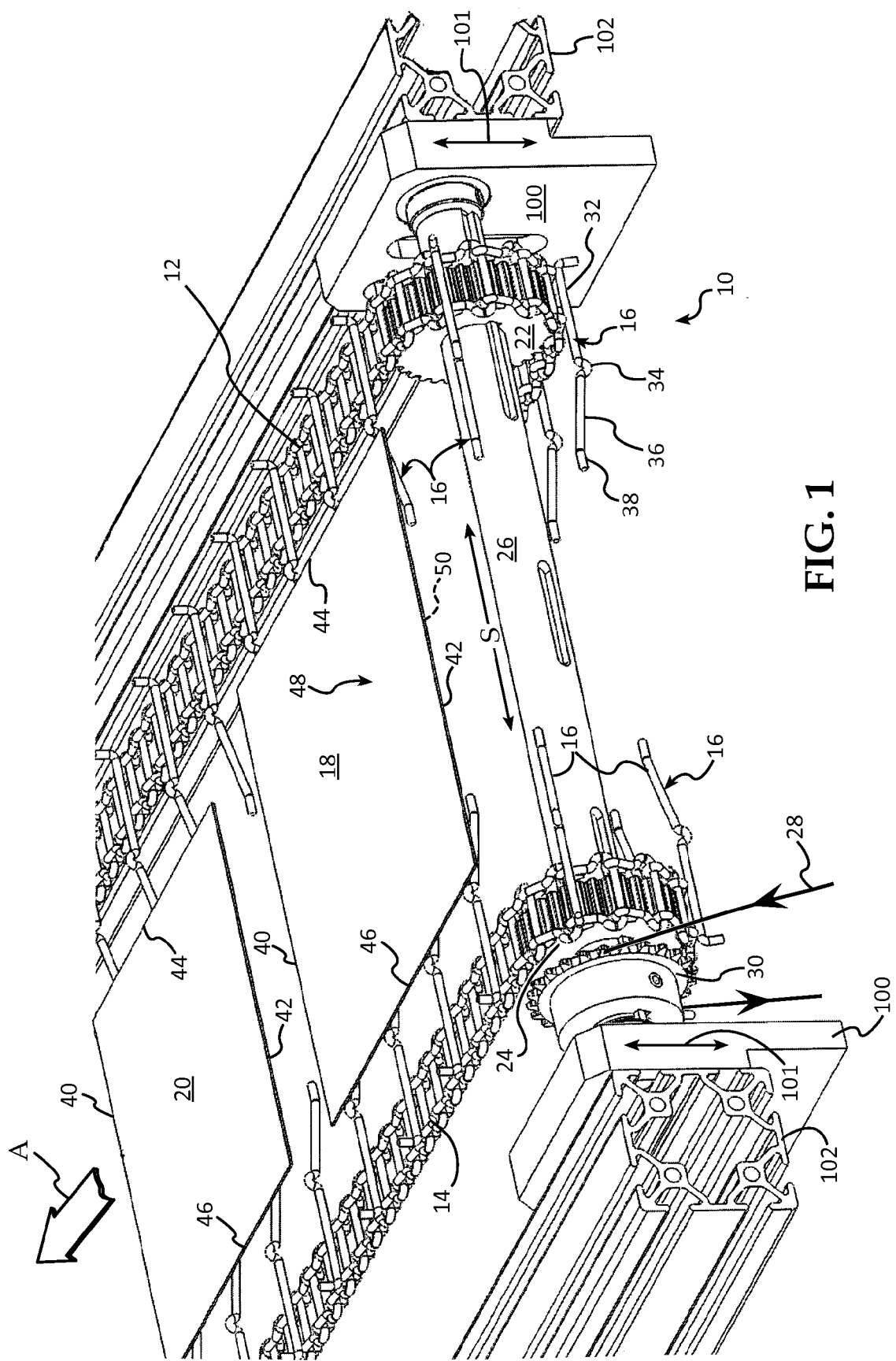
FIG. 1 is an isometric view of a first embodiment of the inventive finger drive from the front left side showing two sizes of wafers in transport position for passage through processing zone(s), the wafers moving from lower right to upper left.

FIG. 1 shows a first embodiment of the inventive transport system 10 from the left inlet or front end of a UV pre-treater, doper, diffusion furnace, dryer, or metallization furnace in which it is installed. By way of example only, the inventive transport system is particularly suited to metallization firing of solar cell wafers, described in more detail below. The transport 10 comprises a right side wafer conveyance member or means 12, and a left side wafer conveyance member 14, both preferably identical finger chains that both support the wafers and move them through the processing zones. As shown in this first embodiment, the transport conveyance members 12 and 14 are single-link-width D-link type wire chains. However, one skilled in the art will appreciate that a wide range of transport wafer conveyance member means may be used, including bands or tapes, roller chains, and multi-link-wide chains of various types and sizes. In its broad aspect, the inventive transport system comprises a drive assembly including a drive motor disposed and linked to drive a pair of spaced parallel wafer conveyance members along a processing path in a first direction from an entry input end to an exit output end, and returning the conveyance members back to the input via a series of redirecting sprockets and/or rollers and including a wafer conveyance member tensioning system. In the detailed description that follows, the conveyance members are finger chains or bands and will be referred-to as "chains", meaning either type.

Conveyance chains 12 and 14 are spaced apart by a width that is suitable for a particular wafer dimension. As shown in FIG. 1, the chains 12 and 14 are spaced wide enough apart to convey in single file, either, or both simultaneously, 6" or 5" wafers, 18 and 20, respectively, in the direction shown by Arrow A. The plane of the wafers being transported on the transport system drive assembly 10 defines a processing path through the furnace, doper or dryer.

Fingers 16 are secured to alternate links of the transport system conveyance chains 12 and 14. The fingers 16 are disposed oriented transverse to the direction A of travel of the chains 12 and 14. The fingers project into the space between the chains, but do not touch, leaving a gap S. In this embodiment, the fingers of spaced, opposed chains are not joined. That is, there is no conveyor portion under the center of the wafers along the processing path A. Accordingly, there are no center support tube or rod elements for the conveyor. Thus, in the inventive transport system 10, there are neither conveyor mesh or quartz slide tubes or rods that block or shadow the bottom of the wafers from the IR lamp radiation, nor prevent access to either the upper or lower heating zones when the furnace is opened for service.

The two side transport conveyance members 12 and 14 are synchronously driven by two transport sprockets 22, 24 mounted on a common drive shaft 26. In turn, the drive shaft 26 is rotated, counterclockwise in this view, by a drive chain 28, shown schematically, which engages drive sprocket 30.

Each finger element 16 comprises a shank segment 32, a knuckle 34, which functions as a lateral stop to prevent sideways movement of the finger and the wafer during processing transport, an elongated support segment or "digit" 36 that is inclined down from the horizontal in the range of from about 5° to about 45°, and terminates in a tip segment 38 that is bent generally horizontal with respect to the support segment. The bend at the junction of the tip segment 38 and support digit segment 36 assists in preventing narrower width wafers, such as wafer 20, from sliding up the support segment on one side and off the tip of the finger on the other side. Generally, the diagonal distance between the bend 36/38 of the finger on one side and the stop knuckle 34 of the opposed finger is not greater than the width of the wafers being transported. Note that the shank segment 32 may be any convenient length with the knuckle 34 being disposed closer to or farther from the side of the chain element carrying it, as processing zone clearance considerations necessitate.

The wafers 18, 20 are planar, on the order of 0.0130" to 0.0200" in thickness and generally rectangular, being bounded by a leading edge 40, a trailing edge 42, a right side edge 44, a left side edge 46, a top surface 48 and a bottom surface 50.

It is an important feature of the invention that, unlike present commercially available mesh conveyor drives or solid ceramic roller drives, the wafers in the instant invention are supported or suspended during transport through processing zones only at points along the knife edge defined as the juncture of the bottom surface 50 and the right side edge 44 and the left side edge 46. Thus, in the inventive drive system 10, there are no contacts with the bottom contact layer or paste on bottom surface 50 as the wafer is being fired, whether used in a doper, a dryer, a diffusion furnace or a metallization furnace. In addition, there is no shadowing by underlying conveyor elements, e.g., conveyor mesh, quartz rods, solid rollers, or the like. The inventive concept includes suspending the wafers at their edges during transport.

The drive shaft 26 is mounted at each end in a side bearing block 100, each of which is mounted to a furnace frame rail 102, and optionally adjustable in a straightforward manner as shown by arrows 101. The frame construction of a furnace or dryer is straightforward and not shown so as to not complicate the essential features of the inventive transport and drive system. A pair of common-shaft-mounted idler rollers or sprockets is provided at the outlet end of the unit, and tensioning assemblies, one for each chain, are provided in the return path, the conveyance members (e.g., chains 12, 14) being continuous loops. The outlet end of the furnace is preferably the driven end and the tensioning system is preferably adjacent the inlet end.

Figure 2:
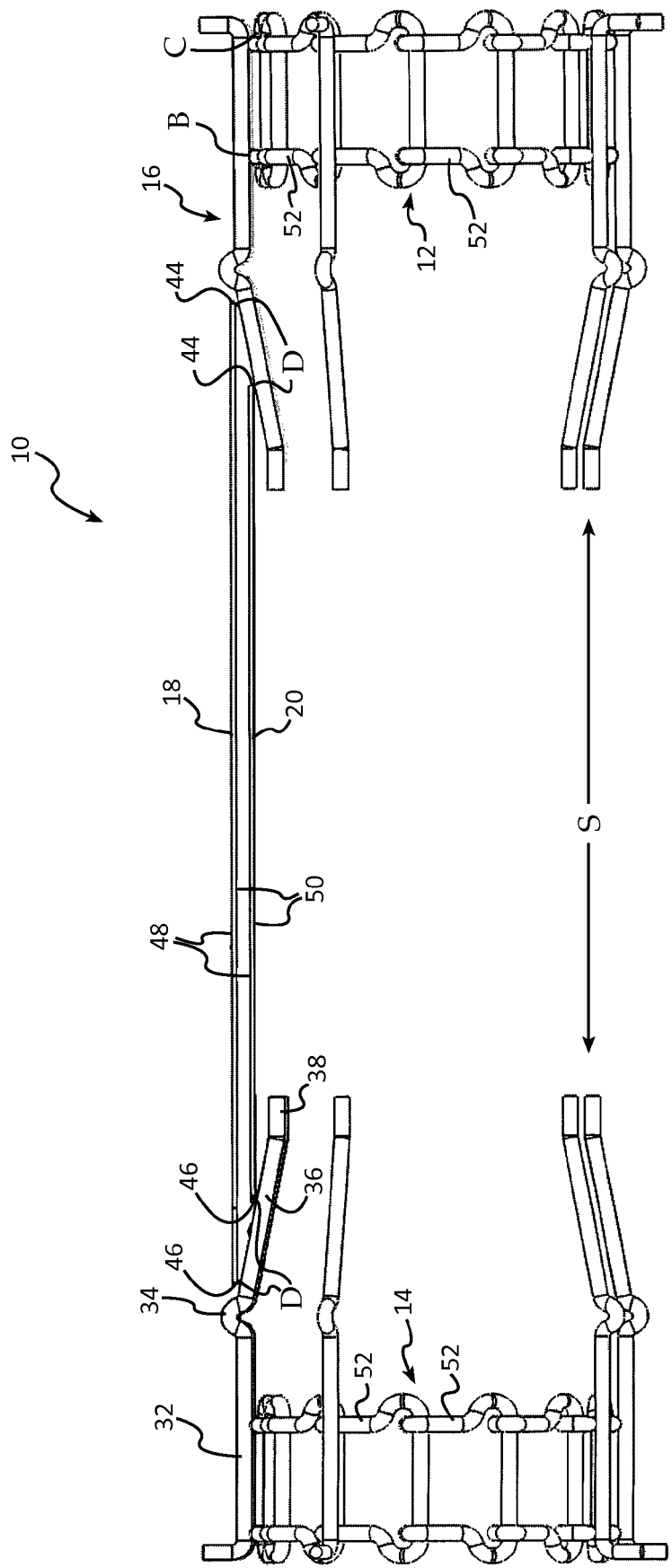
FIG. 2 is a front elevation of the inventive drive of FIG. 1 shown transverse to the direction of travel through the processing zone(s) of a furnace, doper or dryer, the contour of the fingers being shown.

FIG. 2 shows in a front end elevation the inventive transport system 10, without the drive shaft or transport sprockets for clarity. However, shown in proper orientation and spacing are the right finger chain member 12 and the left finger chain member 14. In this first embodiment, the transport system wafer conveyance member chains are single width D-type links 52 made of high thermal capability wire. Both a large wafer 18 and a small wafer are shown, edge supported by the support digit sections 36 of the finger 16. The support digit section is shown with an exemplary, approximately 10° angle, downward from the horizontal. The wafers, as shown, are transported through the processing zones in a horizontal plane. In this embodiment the fingers are secured to the chain links 52 by welding at points B and C. In this embodiment, the chains and fingers are formed of round Stainless Steel (SS), Nichrome (preferred) or Inconel wire, typically of diameter in the range of 0.050" to about 0.1", with the preferred range of 0.064" to 0.092". For use in doper-related processing, the SS chains and fingers are coated with a TiN layer to passivate the metal. For diffusion furnace operation, the Nichrome or Inconel wire chains and fingers may be passivated with TiN coating, or covered with ceramic, quartz or zirconia tubes or glass coated, as described in more detail with reference to FIGS. 4A and 4B, below.

As best seen in FIG. 2, since the finger is round in cross-section, and the wafer planar and oriented horizontal with the side edges 44 and 46 being vertical, the juncture of the bottom surface 50 with the side edges 44, 46 is a line. Thus, the wafer side edge juncture line 50/44, 46 intersects the circumference of the finger support segment wire in a tangent. The result is only point contact of the wafer with the transport mechanism, this point being identified as D. Of course, multiple fingers engage each side edge of the wafer, it being preferred that at least two points of contact are maintained on each side edge of each wafer during transport throughout the entire length of the processing zone(s) of the particular unit.

Note that the fingers terminate a distance apart, S, that is 60-95% the width of the wafer. Thus, the IR radiant flux from the IR lamps below the wafers is unobstructed, and there is essentially no shadowing of the wafer. Further, the fingers are smaller in diameter than the distance that the lamp IR radiation sources are spaced from (below) the wafers, and they move with respect to the lamp array, so that any minor shadowing is only momentary. Thus, the wafer bottom surface 50 receives, edge to edge, essentially 100% of the lamp output radiant flux.

It is further evident from FIG. 2 that the finger support segment 36 may be made substantially shorter, the tip 38 eliminated, e.g. in cases where the side wafer transport chains 12, 14 rest on and move smoothly on quartz, silicon carbide or zirconia slider bars (not shown), and/or there are no air (or other furnace atmosphere gases) currents in the processing zone(s) to disturb the wafers during processing transport. The side stops 34 on opposed fingers constrain lateral movement of the wafers.

Figure 3A:
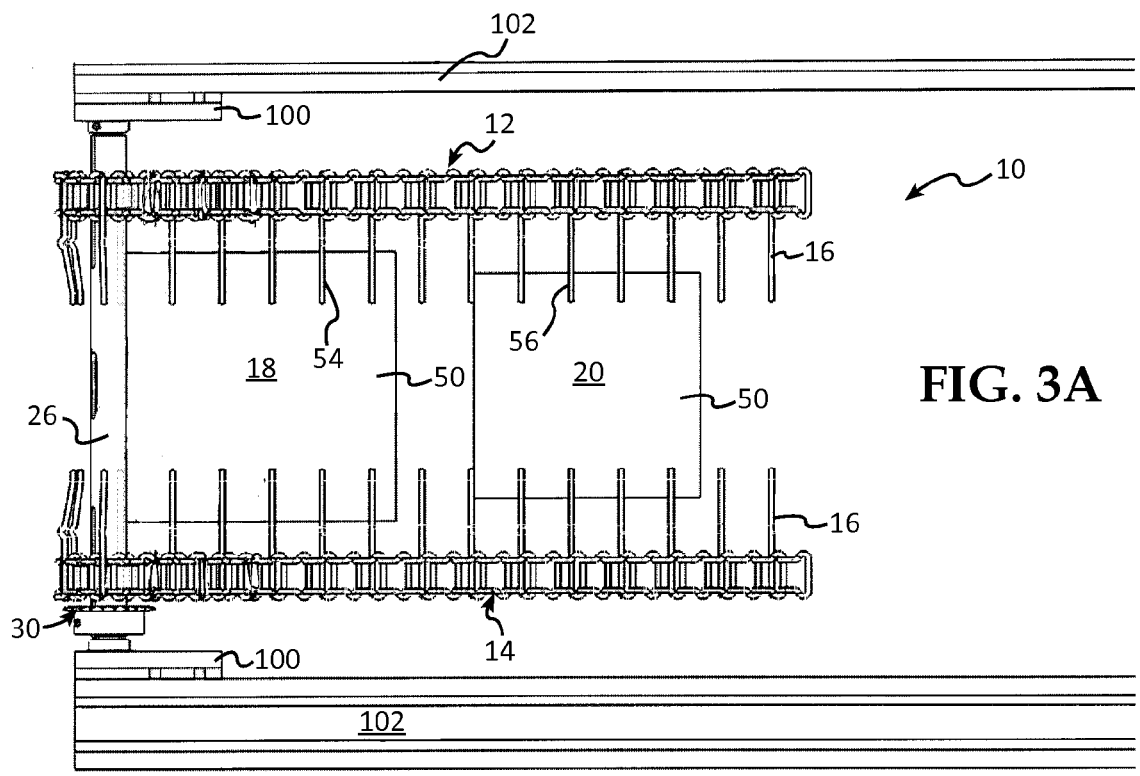
FIGS. 3A and B are plan views of the drive of FIGS. 1 and 2, FIG. 3A being a bottom view looking up at the wafers, and FIG. 3B being a top view looking down on the wafers.
Figure 3B:
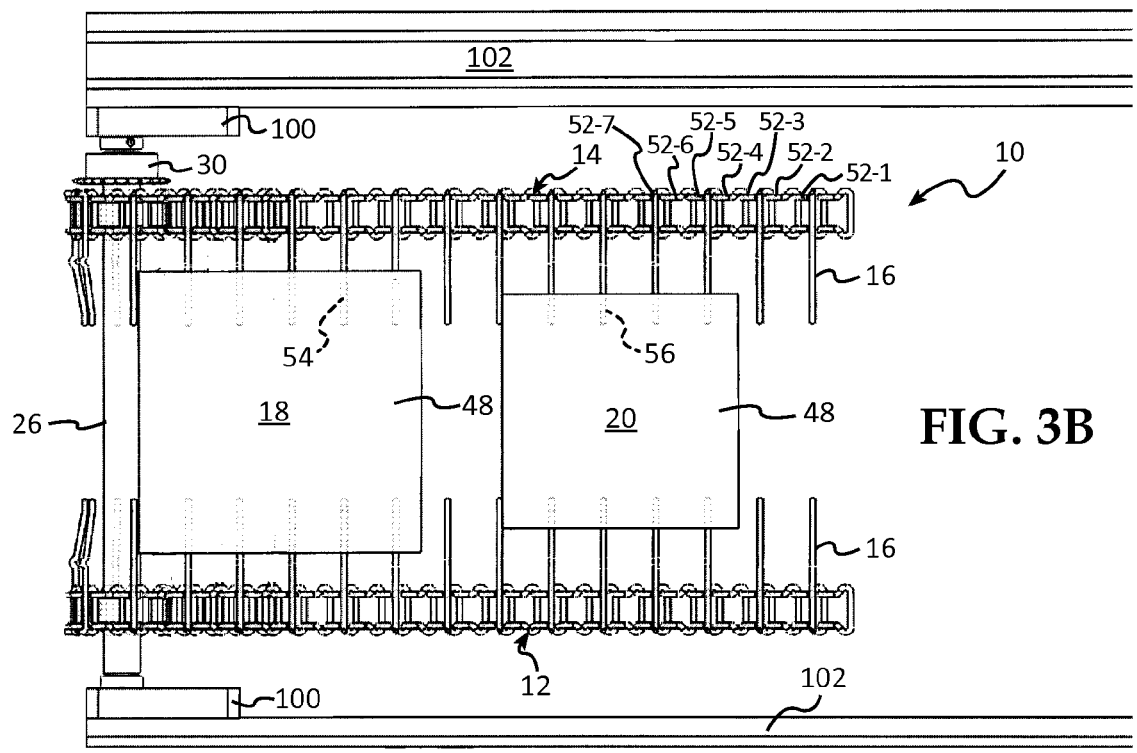

FIG. 3A is a view from underneath the wafers in transit showing the non-obstructing feature of the inventive finger drive 10. FIG. 3B is a top plan view showing the use of the transport 10 for multiple sized wafers 18, 20 in a single processing line. Note from both FIGS. 3A and 3B that the fingers are secured to every other chain link 52-1, 52-3, etc, so that, as shown each wafer is supported by 4 to 5 fingers on each opposed side edge of each wafer. In an alternative embodiment, more or fewer fingers may be used, one every link, 52-1, 52-2, 52-3, etc, one every third link 52-1, 52-4, 52-7, etc. Likewise, the fingers on one side transport chain may be on odd numbered links, and on the other side transport chain on even numbered links.

Thus, a plurality of fingers support each wafer on each edge, at least two per side edge being preferred, so that in the event of damage or loss of a finger, e.g., through weld failure, there are enough remaining fingers to adequately and stably support a wafer during processing transport. Where, for example, only larger wafers are transported for processing, the fingers may be shorter. As shown in FIGS. 3A and 3B, the inventive drive has universal fingers. That is they are long enough to handle multiple wafer sizes. Where the drive is dedicated to a single wafer size, the fingers can be sized to have only a minimum extent of the finger projecting inwardly below the wafer. Compare the extent of finger overlap 54 in the case of large wafers 18 with the shorter overlap 56 for smaller wafers 56. Thus, for example, for transport of large wafers 18 only, the fingers can be shortened to have an overlap similar to 56.

FIGS. 4A and B illustrate a second embodiment of the inventive transport 10, particularly useful in processing operations where potential contamination from metal is to be avoided, for example, in diffusion firing of wafers. In this embodiment, seen from the output end of the furnace, the support segment 36 includes a sleeve 38 over it, the sleeve being a tube of high temperature resistant material, such as: ceramic, silicon carbide, zirconia, quartz or glass. In FIG. 4A the drive as in FIG. 1 is shown, with each finger carrying a protective sleeve to provide minimal exposure of metal to the IR radiation and heat. The ceramic or glass sleeves are easily fitted over the wire support segments 36 during the operation of forming the fingers 16. After the knuckle stop 34 is formed in the wire, but before the tip is formed by bending the finger end, the protective tube 38 is slipped over the wire to abut against the stop 34, and then the tip 38 is bent. The bend juncture of support segment 38 and tip 36 retains the sleeve 38 in place.

As seen in FIG. 4A, in this embodiment both the large wafer 18 and small wafer 20 are point-supported at the wafer side edges on the tubular ceramic or glass sleeves. Thus, there is no metal to wafer contact to propagate contamination. This solution eliminates the need for very high mass solid ceramic rollers for transport, as are currently used in diffusion firing of phosphate doping compositions into the silicon wafer top surface 48 to form the p-n junction layer. The result is a far more energy efficient furnace, and the unobstructed bottom surface 50 permits a much faster product throughput.

FIG. 4B shows in enlarged detail this protected finger embodiment for a dedicated processing unit (furnace, doper, dryer, etc). In this alternative, note that both the support segment 36 and the tip 38 are very short (stubby), thus minimizing any shadowing, as radiation from the right half of the IR lamps 62 reaches under the fingers on the left to the left edge of the wafers, and radiation from the left half of the lamps reaches under the fingers on the right to the right edge of the wafers. In addition, as a finger passes over a lamp, the radiation from the downstream lamps and from the upstream lamps reaches the wafer edges.

Note in both FIGS. 4A and 4B a slide bar or plate 60 is positioned to support the longitudinal length of the side drive members 12, 14. These are typically smooth quartz plates or rods, or may be made of a smooth, high temperature and abrasion-resistant glazed or unglazed ceramic, silicon carbide, or zirconia. As shown in FIG. 4A the top of the slider bar 60 is planar, whereas in FIG. 4B the bar top surface is grooved or formed into a U-shape trough having upstanding side walls, or an L-shape to provide an edge lip, in order to maintain proper linear tracking of the side drive members 12, 14 without lateral wandering.

The inventive differential lateral heating method of the invention may be implemented in the case of IR lamp furnaces in a variety of manners, e.g., as shown in FIG. 4B, by transversely oriented IR lamps having heavier or multiple filaments on one side than the other. As seen in FIG. 4B, the transverse lamp 62 has a filament 110 that includes a heavier segment 112 on the right side, so that there is more heating of the right side of the wafer, or right Lane in the case of a dual lane furnace, due to the increased radiant flux emitted by that segment of the filament.

Alternative methods of differential lateral heating include, by way of example: by additional lamps added to one side of the transport path; by shielding or partial shielding one side of transversely oriented IR lamps; and by configuring processing zone(s) in which IR lamps are oriented parallel to the transport path with more lamps on the side to be heated hotter than on the cooler side. In another alternative method, additional short IR lamps having a length half or less the transverse width of the processing path, or only one of two lanes, are provided on the side or lane to be heated more. These short lamps may be by themselves in an array, or interspersed between the full width transverse lamps 62. Still further, in the case of a dual lane processing system, interspersed between full width lamps may be lamps having only a straight, non-radiating portion of the lamp filament 110 in the area of a first lane, and coiled, fully radiating filament portion 112 in a second lane (FIG. 4B). In the alternative, separate banks of lamps may be provided for each lane, with a longitudinal separator wall between, e.g., on which a center dual opposed finger chain is mounted (FIG. 8C), and more lamps or lamps being provided with more power for one lane (the hotter lane) than the other (the cooler lane).

Figure 5:
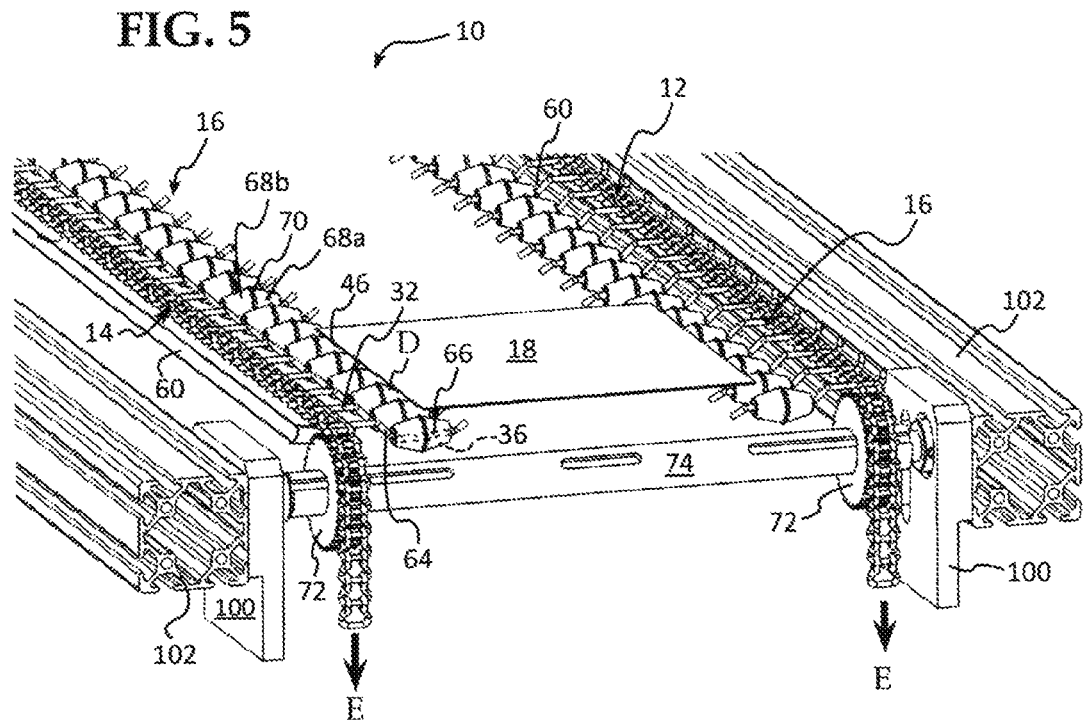
FIG. 5 is an isometric view from the front left side of a third embodiment in which the finger protective covers are spool or barrel shaped.

FIG. 5 shows in isometric a third embodiment of the inventive drive 10 viewed from the outlet end of the processing apparatus, in which the transport wafer conveyance means 12, 14 are guided by slider bars 60 and directed over idler rollers or sprockets 72 mounted on a common idler shaft 74. The chains 12, 14 continue down to a return path E back to the entrance end of the apparatus as seen in FIGS. 1 and 4A. As noted above, the idler shaft 74 can be a driven shaft with the transport chains pulled through the apparatus.

In this third embodiment, the fingers 16 optionally include an intermediate section 64, which may be inclined downwardly as shown, or in the alternative, upwardly, and the support segment 36 is generally horizontal. Mounted on the support segment 36 is a protective sleeve 66, and the wafer edges make point contact with the surface of a plurality of the sleeves, as in the embodiment of FIGS. 4A and 4B. In this embodiment the sleeves take a bi-conical form 68a, 68b, oriented base to base, the two cone bases being joined at a rib segment 70. The inclined surface of the cone 68a provides the inclined plane which provides the point contact D with the wafer side edge 44, 46. The finger protective sleeves may also be characterized as spool or barrel-shaped, and may be single conical, instead of bi-conical, with the base of the cone oriented facing the side edge of the associated transport chain 12 or 14, as the case may be. Note the tip 38 is shown as bent down on the right chain of this view, but in the alternative, may be bent upwardly, as seen on the left chain.

Figure 6:
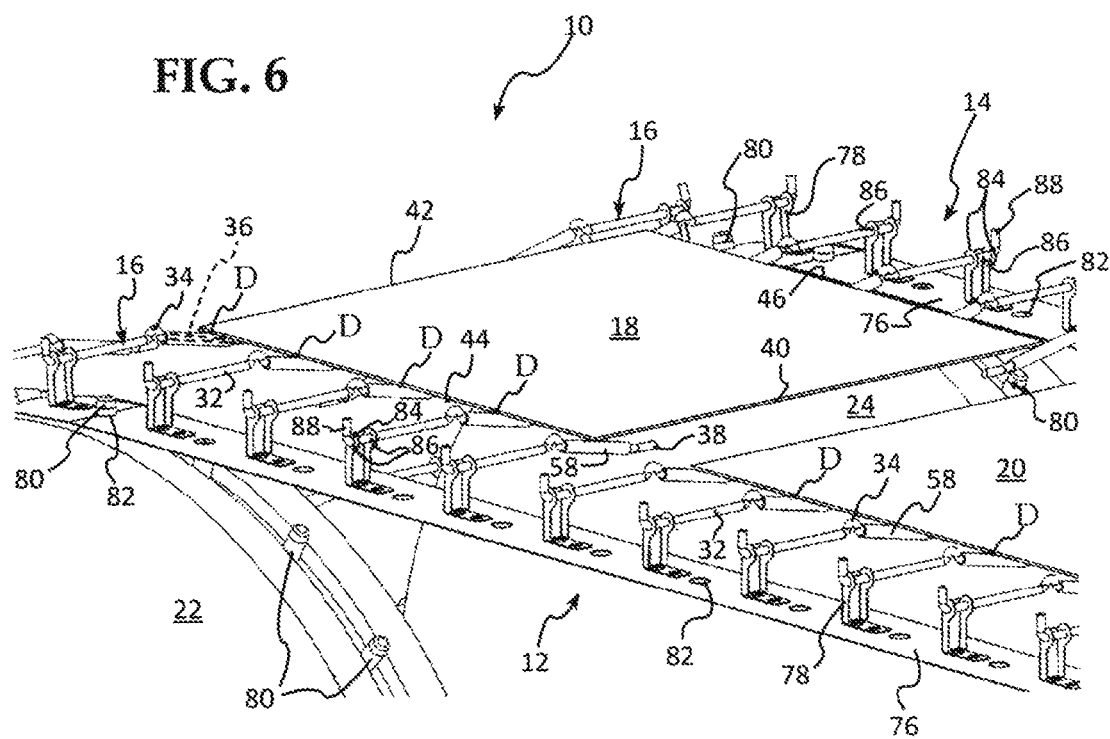
FIG. 6 is an isometric view from the right just downstream of the conveyor entry showing a fourth embodiment in which the transport means comprise drive bands with the fingers of the second embodiment retained in upstanding spaced pylons.

FIG. 6 shows in isometric view of a fourth embodiment of the inventive transport system 10 in which the wafer conveyance means 12, 14 comprise transport bands 76, fitted with the fingers 16 of the second embodiment (which include protective sleeves 58) retained in upstanding spaced pylons 78. The pylons 78 are U-shaped in horizontal lateral cross-section and include side flanges, as shown. The bands 76 are driven by pins 80 mounted around the circumference of drive wheels 22, 24 that engage holes 82 in the bands 76. Each spaced pylon 78 includes side ears 84 adjacent the upper end, in which holes 86 are formed to receive the shank 32 of the finger. The tail segment 88 provides a lateral stop for the finger assembly 16. The stop, as shown is a segment of finger wire that is bent to one side, but may include a threaded end and stop nut, a cap nut, a hole and cotter pin, a C-clip, or other suitable stop. The shank 32 is selected for length to accommodate the furnace geometry, and may include one or more spacers or collars between the inboard ear 84 and the knuckle 34. A second stop device (not shown) may be included just inboard of the inboard ear 84 as a second lateral stop.

Figure 7A:
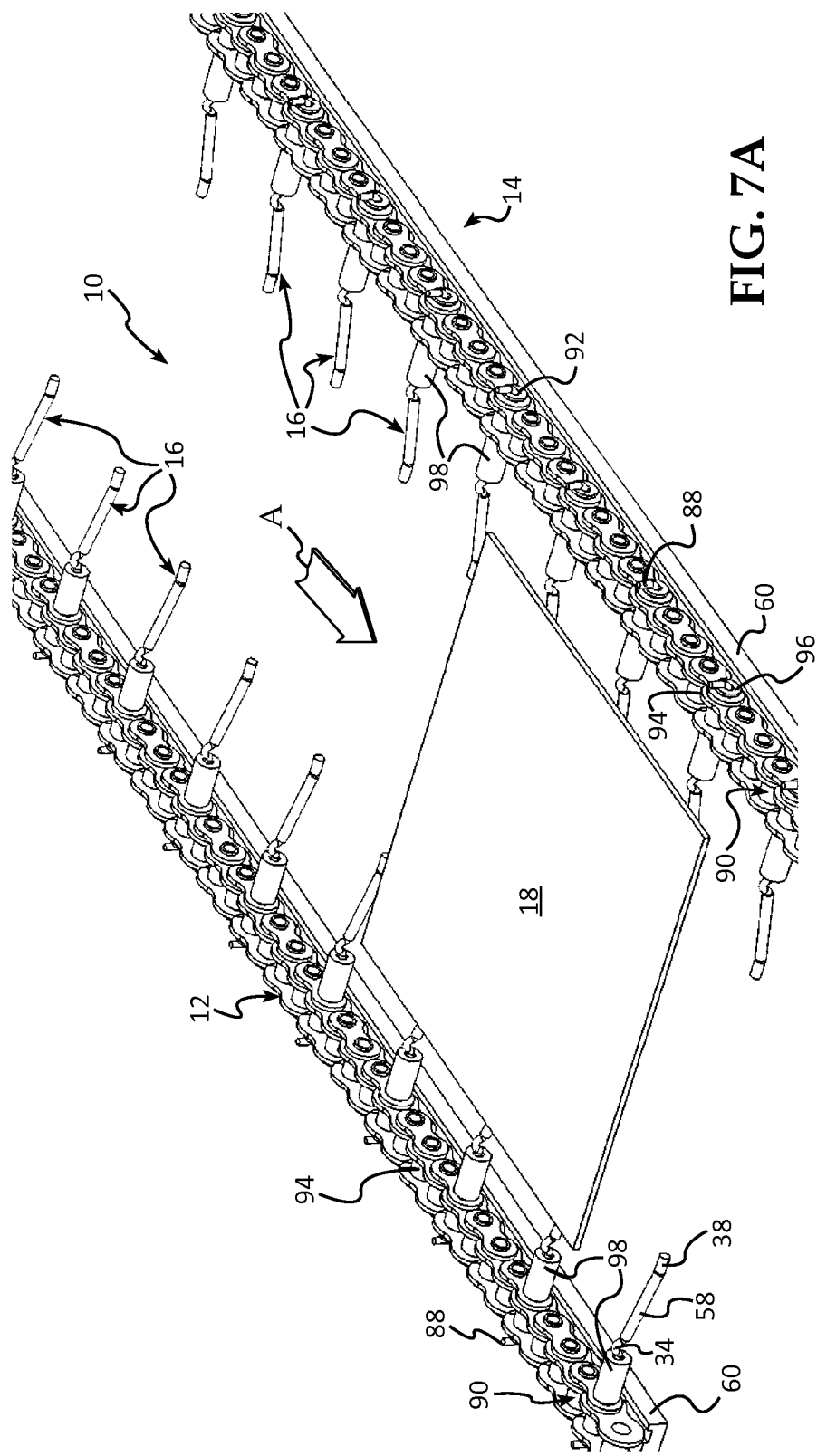
FIGS. 7A and 7B illustrate a fifth embodiment in which the transport means are roller chains, FIG. 7A being an isometric view from front right, and FIG. 7B being a front elevation; in both views the drive gearing has been omitted as not essential to the view.
Figure 7B:
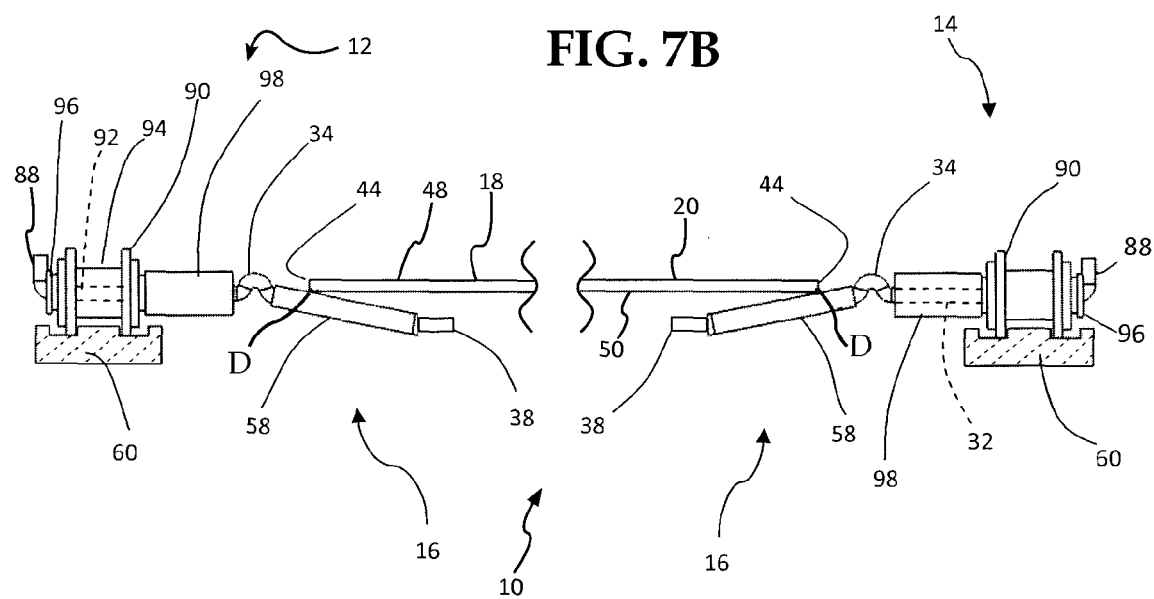

FIGS. 7A and 7B show a fifth embodiment of the inventive transport system 10, in which the wafer conveyance means 12, 14 are roller chains 90 in which the fingers 16 are fitted in the pivot tubes 92 of selected chain links. The chain rollers 94 are fitted over the pivot tubes 92. As best seen in FIG. 7B, spacer washers 96, or/and collars 98 may be employed to maintain lateral position of the fingers 16 with respect to the chain 90. Instead of the stop being a tail 88, a C-clip received in a circumferential grove in the wire may be used.

Figure 8A:
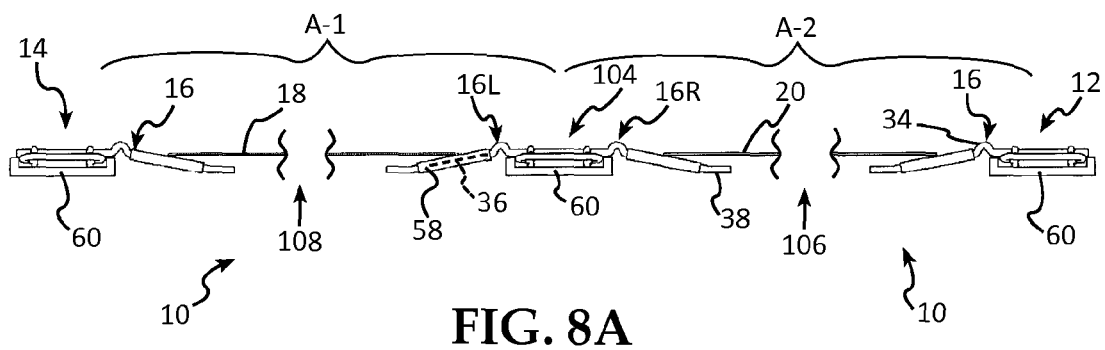
FIGS. 8A, 8B and 8C illustrate a sixth embodiment in which three spaced transport means are used to form a dual lane drive system, FIG. 8A being a transverse elevation.
Figure 8B:
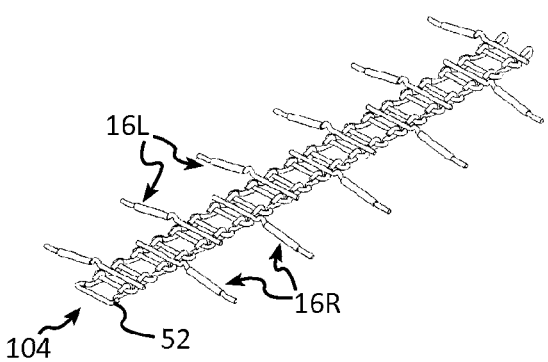
Figure 8C:
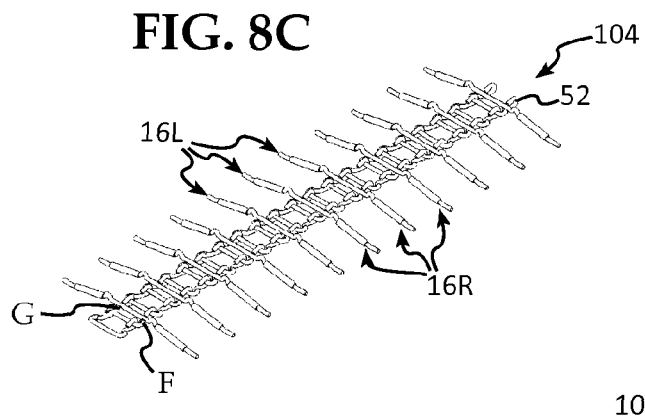

FIGS. 8A, 8B and 8C show an exemplary implementation of the inventive transport system 10 which is configured with three wafer conveyance means, side means 12 and 14, and a center conveyance means 104 having alternating fingers 16R and 16L. As best seen in FIG. 8A, the center conveyance 104 is disposed between the two side conveyances 12, 14 so that there are two lanes A-1 and A-2 for side-by-side simultaneous transport of two wafers, both a large wafer 18 and a smaller wafer 20 being shown by way of example. FIG. 8B shows a first embodiment of the center chain 104 having alternating, staggered positioning of the fingers 16R and 16L which alternately project out opposite sides of the transport chain links 52. In FIG. 8C, single wire fingers, welded at points F and G form left side fingers 16L and right side fingers 16R. In this embodiment, the center transport chain fingers are not staggered. In addition, as seen in FIG. 8A, it is evident to one skilled in the art that adding a second center conveyance chain means 104 at position 106, spaced appropriately laterally between chains 12 and 104, will implement a 3-lane processor, and adding a third center chain 104 at position 108 appropriately laterally between chains 14 and 104, will implement a 4-lane processor, and so on, for any number of lanes needed. Note also in FIG. 8A the use of a U-shaped slider bar 60 under each chain, supported on longitudinal side or center-line walls (not shown, but see 122 in FIG. 9).

Figure 9:
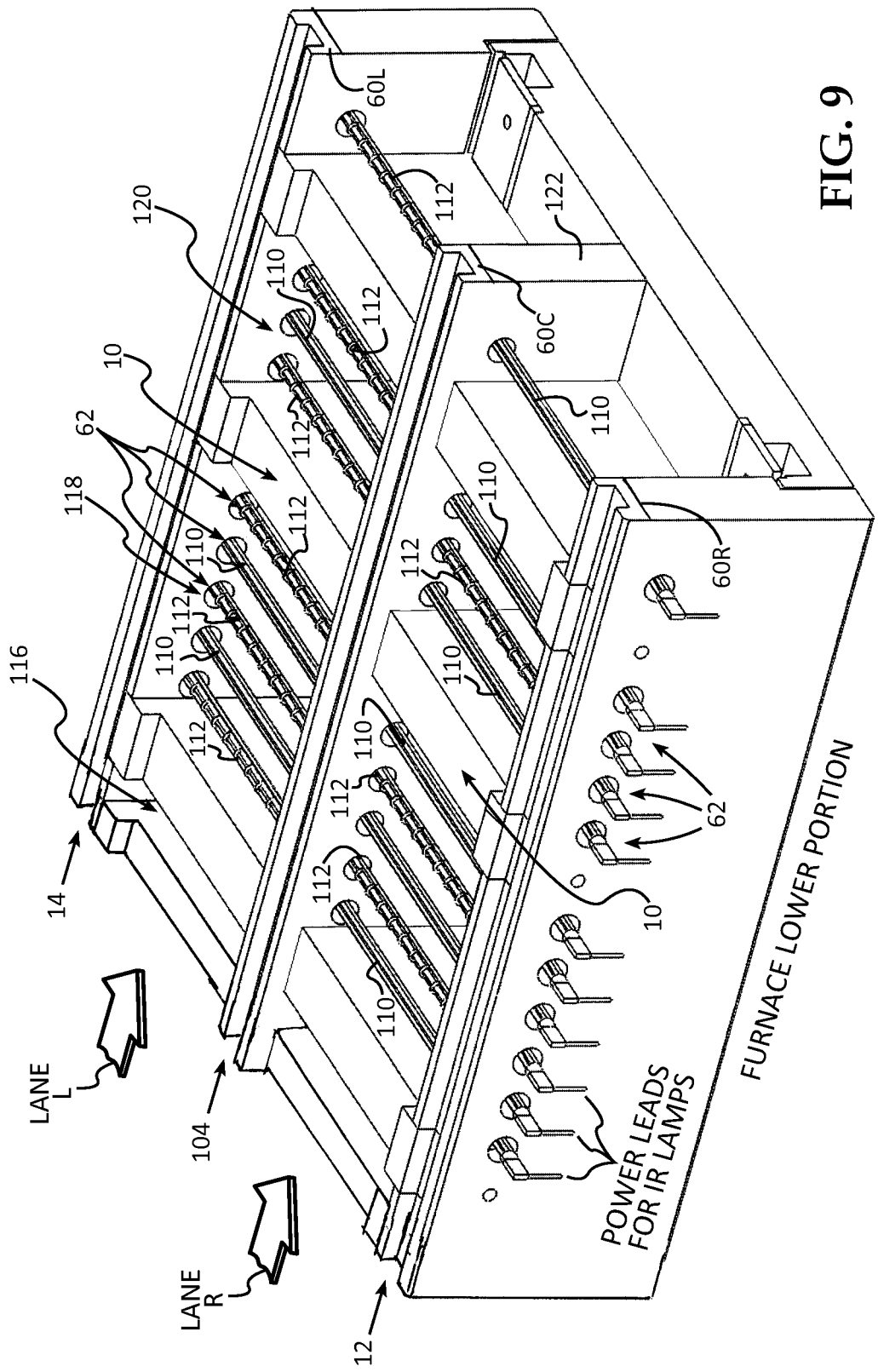
FIG. 9 is an isometric view of a dual lane furnace embodiment in which adjacent zones of each lane includes a different number of IR heating lamps as an implementation of the inventive differential lateral heating method.

FIG. 9 illustrates aspects of this inventive differential lateral heating method in a dual lane furnace 114, comprising a first, Right Lane, shown by the Arrow R, and a second, side-by-side Left Lane, shown by Arrow L. The furnace has a plurality of zones, only three plus zones 116, 118 and 120 being shown. The inventive transport system is omitted for clarity, but reference to FIGS. 4B, 8A, 8C and 8C will provide those drive features. The direction of travel is shown by the Arrows R and L. The chains of the inventive finger drive system travel in grooved slider channels on the sides and center of the furnace, right side chain 12 travelling in channel 60R, center dual-finger chain 104 travelling in channel 60C on the top of center wall 122, and the left side chain 14 travelling in channel 60L. The slider channels may be separate members atop the respective side and center walls of the furnace, or as shown, or an integral part of the vertical walls.

Zone 116 is, by way of example a compressed-air baffle zone at the entry of the furnace, and zones 118, 120 may be pre-heat or/and peak firing zones. Note that in Lane R, Zone 118, there are five lamps, but only two include heating filament segments 112 while three have only power supply segments (see also FIG. 4B). In contrast, in Lane L, Zone 118 has five lamps, three of which have heating filament segments 112, while only two have the power supply segment 110 in that zone. Similarly, Lane R, Zone 120 has only one heating filament segment 112, while Lane L, Zone 120 has two heating filament segments 110, Zone 120 including three lamp elements in each lane. The power to each lamp in each zone may be individually, selectively controlled to provide a different temperature profile along the longitudinal processing path of each zone, the result being that transversely across the furnace, that is, orthogonal to the processing paths, there is differential heating of the respective zones. FIG. 9 illustrates the bottom half portion of the furnace heating zone, by way of example, but one skilled in the art will recognize that a similar or different configuration may be provided for the upper half portion of the furnace. Thus, the method includes thermal profile control, not only lane-by-lane and zone-by-zone, but also upper and lower halves of the furnace.

In an alternate embodiment, the longitudinal center wall 122 may be wide enough to support a pair of side-by-side slider channels 60C to support two, separate, independent chains with fingers, so that each of Lane R and Lane L has its own wafer drive assembly (like that shown in FIG. 1), each of which is independently controllable, so that the rate of transport may be different for each lane. In this alternate embodiment, the number of lamps above or/and below the belt providing IR radiant flux on the wafer work pieces may be the same or different, so that each lane has a fully configurable thermal profile along the length of the processing path, as desired for processing. Thus, one lane may be a fast processing lane for one type or size wafer and the other a slower lane for a different type or size wafer.

Figure 10:
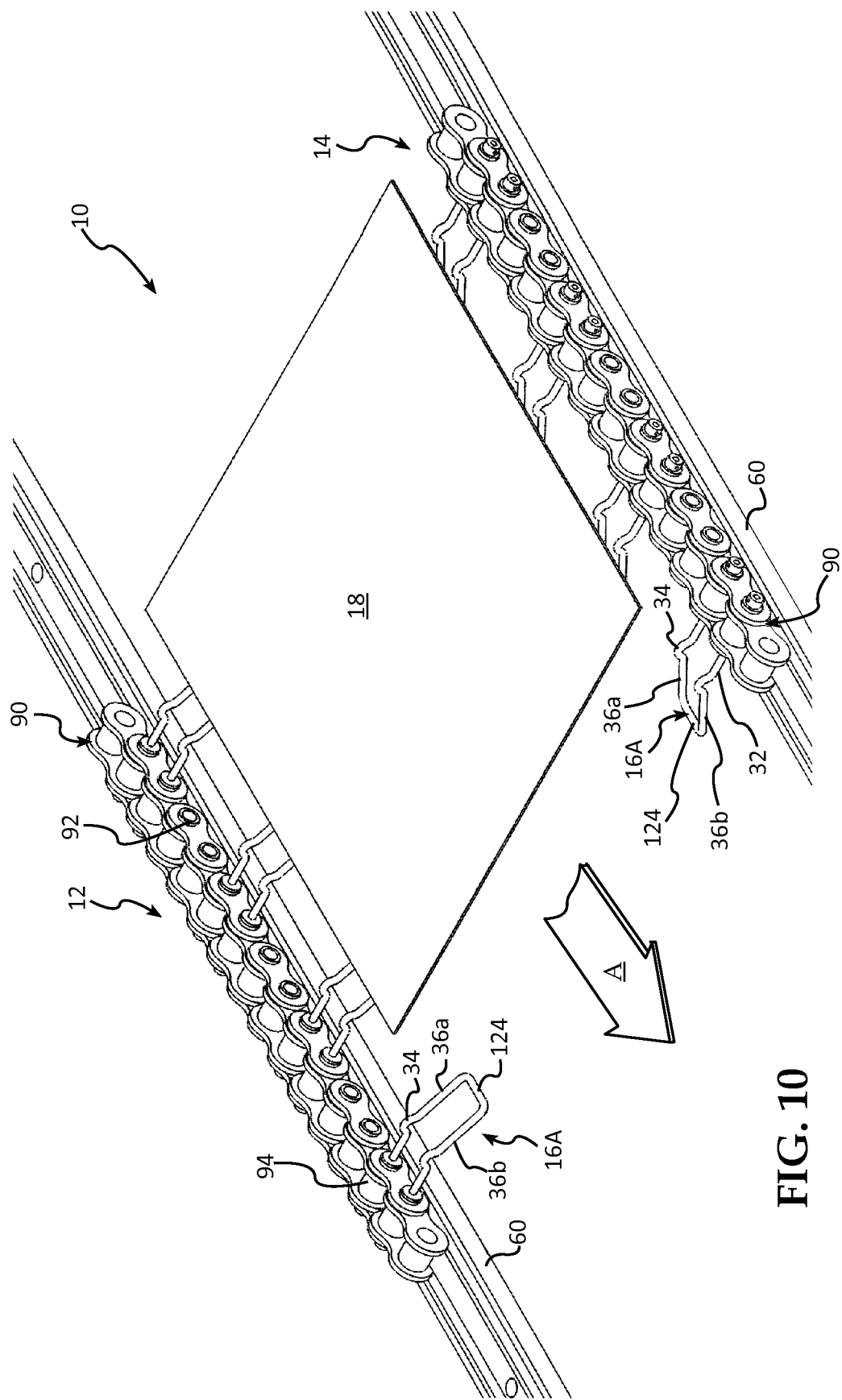
FIG. 10 is an isometric view of a single line showing an implementing embodiment of the double finger caterpillar chain drive system configuration.
Figure 11:
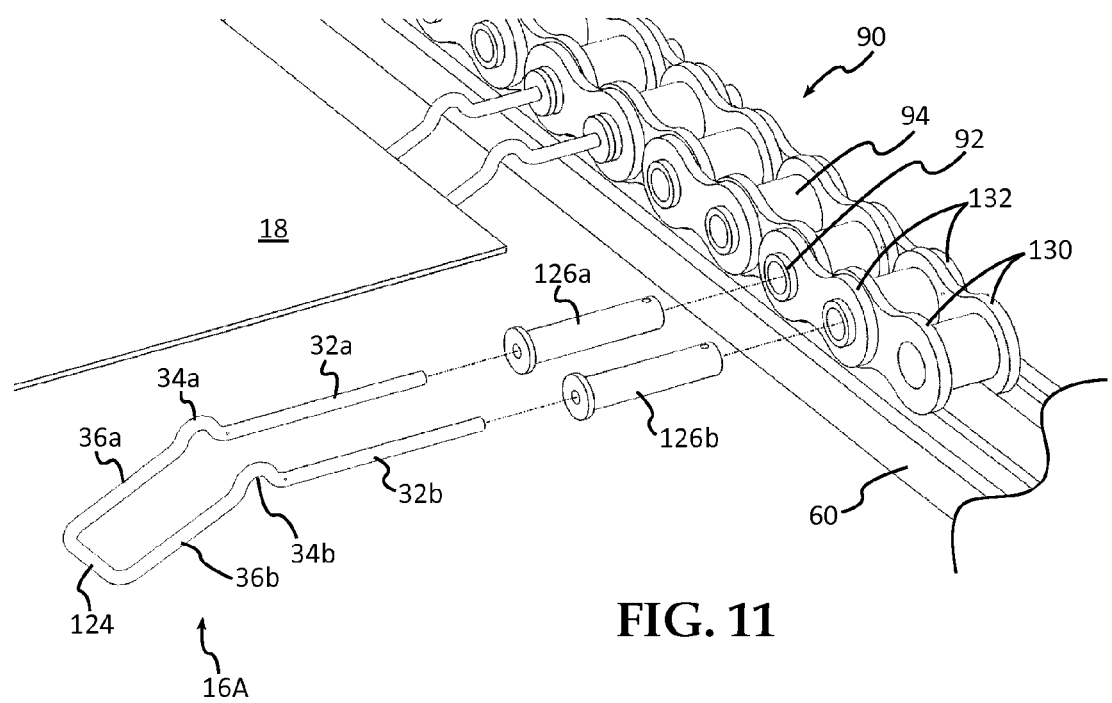
FIG. 11 is an isometric view, partly exploded, showing the mounting of the double fingers of FIG. 10 in the chain links.
Figure 12:
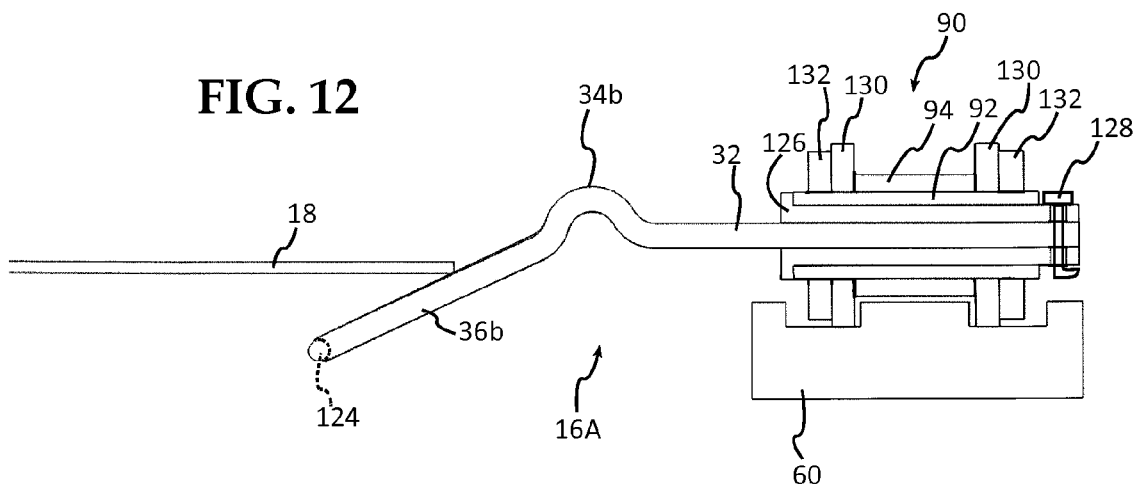
FIG. 12 is a vertical section view through a double finger showing its mounting in a chain sleeve and the edge support of a wafer.

FIGS. 10-14 illustrate a double finger transport system 10 in several embodiments, the common parts numbers being the same as in FIGS. 1-9. FIG. 10 illustrates the roller chain embodiment of FIGS. 7A and 7B adapted with a double finger assembly 16A, which comprises adjacent pairs of fingers (shanks 32a, 32b and digit section 36a, 36b) joined at the outer tip by cross bar 124. As shown in this figure, the double finger shanks are received in the pivot tube elements of a single chain link, and are spaced in alternating links along the chains. FIG. 11 shows an enlarged isometric, partly exploded to show the shanks 32a, 32 b are received in sleeves 126a, 126b that in turn are mounted within the chain pivot tubes 92. FIG. 12 shows in section the mounted double finger 16A in chain link 90, the shank fitting in the sleeve 126. The shank 32 and the sleeve 126 are retained in the pivot tube 92 by a cotter-type pin 128, the head and tip of which are large enough to prevent slipping out the tube 92. Alternatively, a C-clip and groove retainer may be used. The roller chain is otherwise of standard construction, including a roller 94 maintained over the sleeve 92 between inner links 130 that ride on the grooves in the slider bar 60, and the outer keeper links 132.

Figure 13:
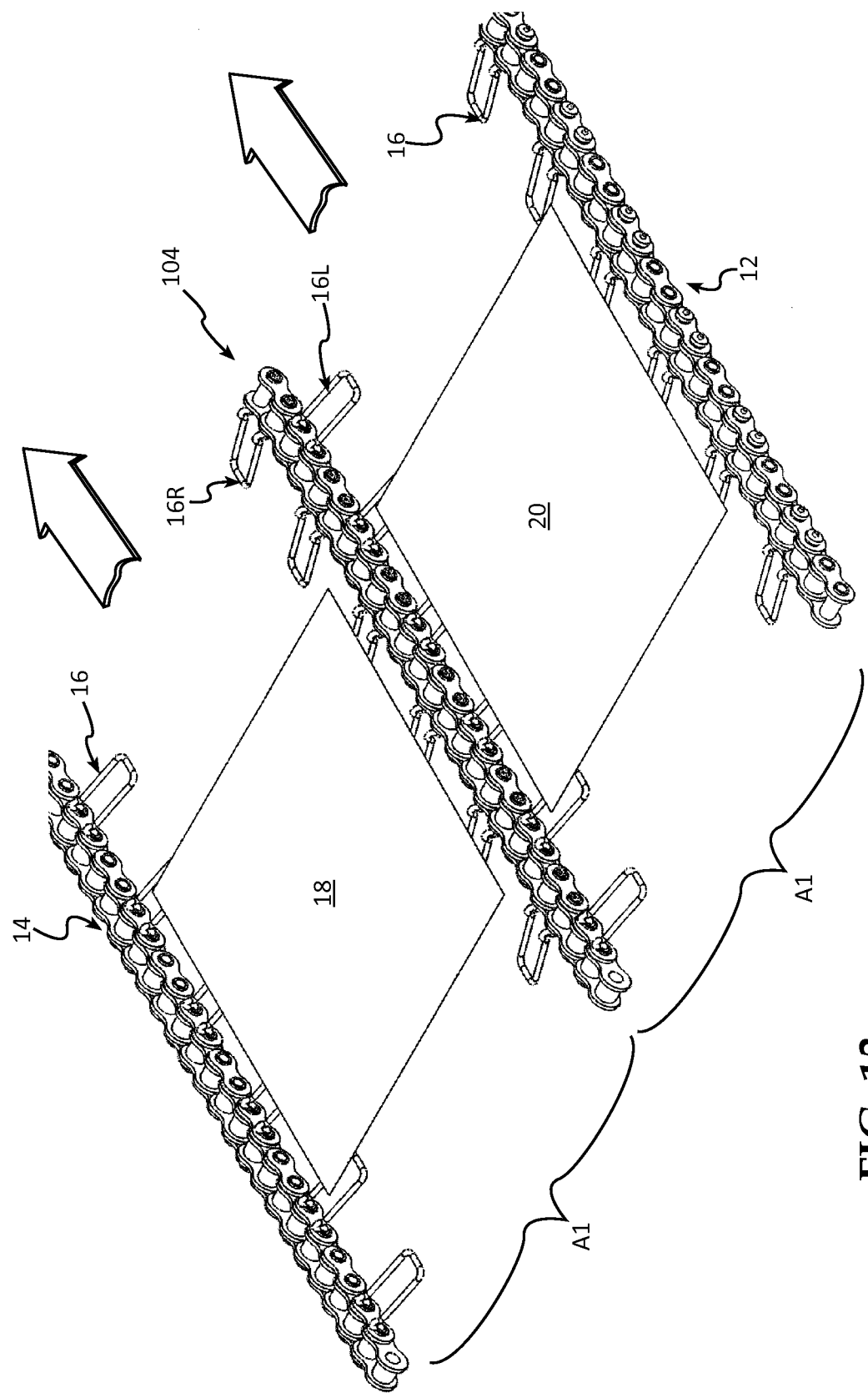
FIG. 13 is an isometric view of a double lane transport system having a single center chain having alternating double fingers on both sides of the center chain.

FIG. 13 shows a double lane transport system (similar to FIG. 8A) having drive lanes A1 and A2 arranged side-by-side in parallel transport arrangement. The right and left chains 12, 14 are as shown in FIG. 10. The center chain 104 has opposed double fingers 16L, 16R mounted in the chain (as shown in detail in FIG. 12) in staggered arrangement, a double finger in each link, with every other link having a double finger extending on one side, with the alternating links having a double finger extending to the other side.

Figure 14:
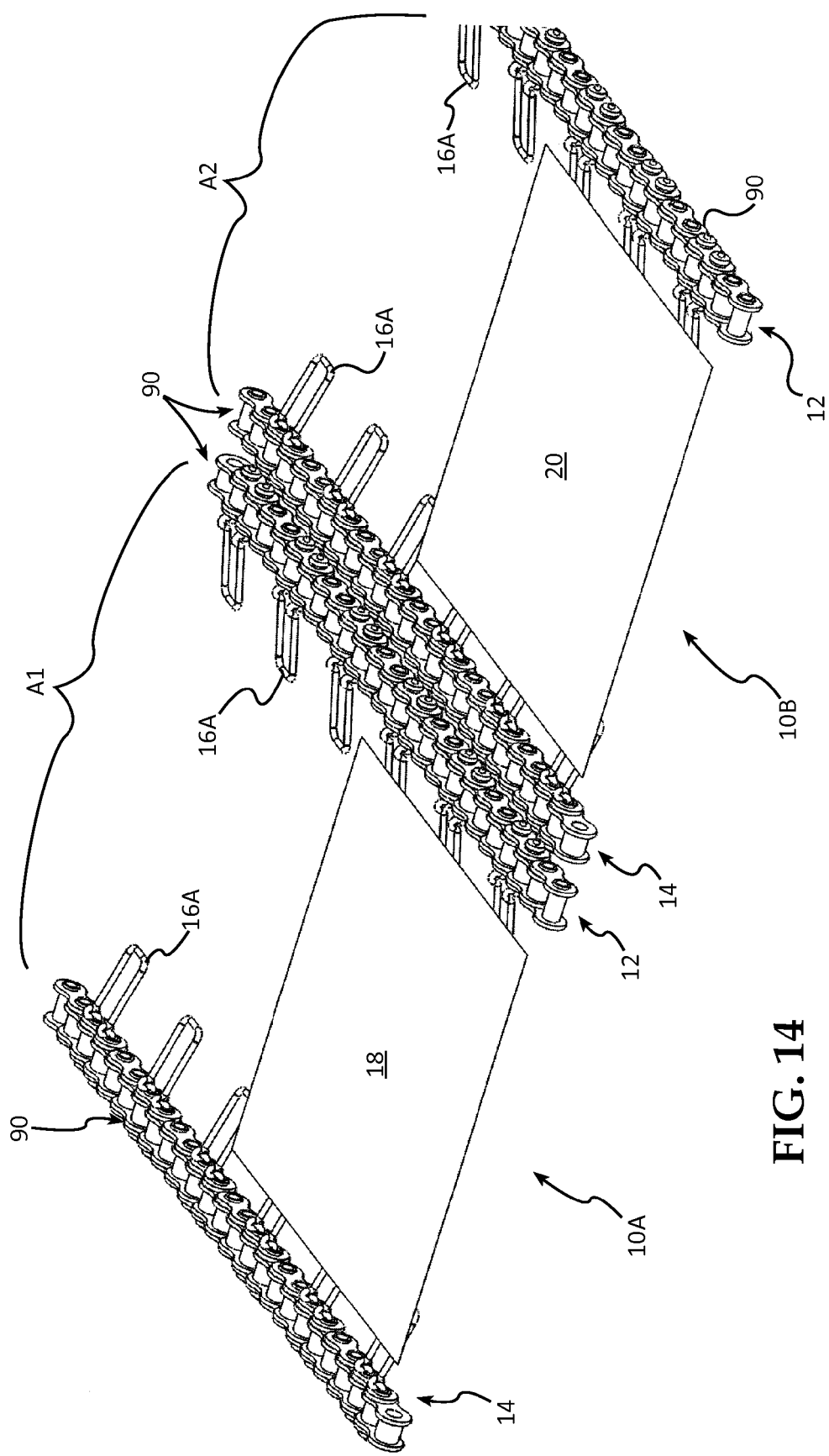
FIG. 14 is an isometric view of a second embodiment of a double lane transport system comprising two single lane drives disposed side-by-side moving parallel to each other.

FIG. 14 shows a second embodiment of a double lane transport system, lanes A1 and A2, in which two single lane systems 10A and 10B of FIG. 12 are arranged side-by-side. A double, side-by-side center longitudinal wall (not shown) may be used to support the two individual center chains, or a single wall having a double slider bar and a separator between (not shown) is preferably used. Although not shown in FIGS. 10-14, the passive sleeve 58 of FIGS. 4A, 4B, 6, 7A, 7B and 8A-8C may be used over the digit sections 36a, 36b, as needed.

Figure 15:
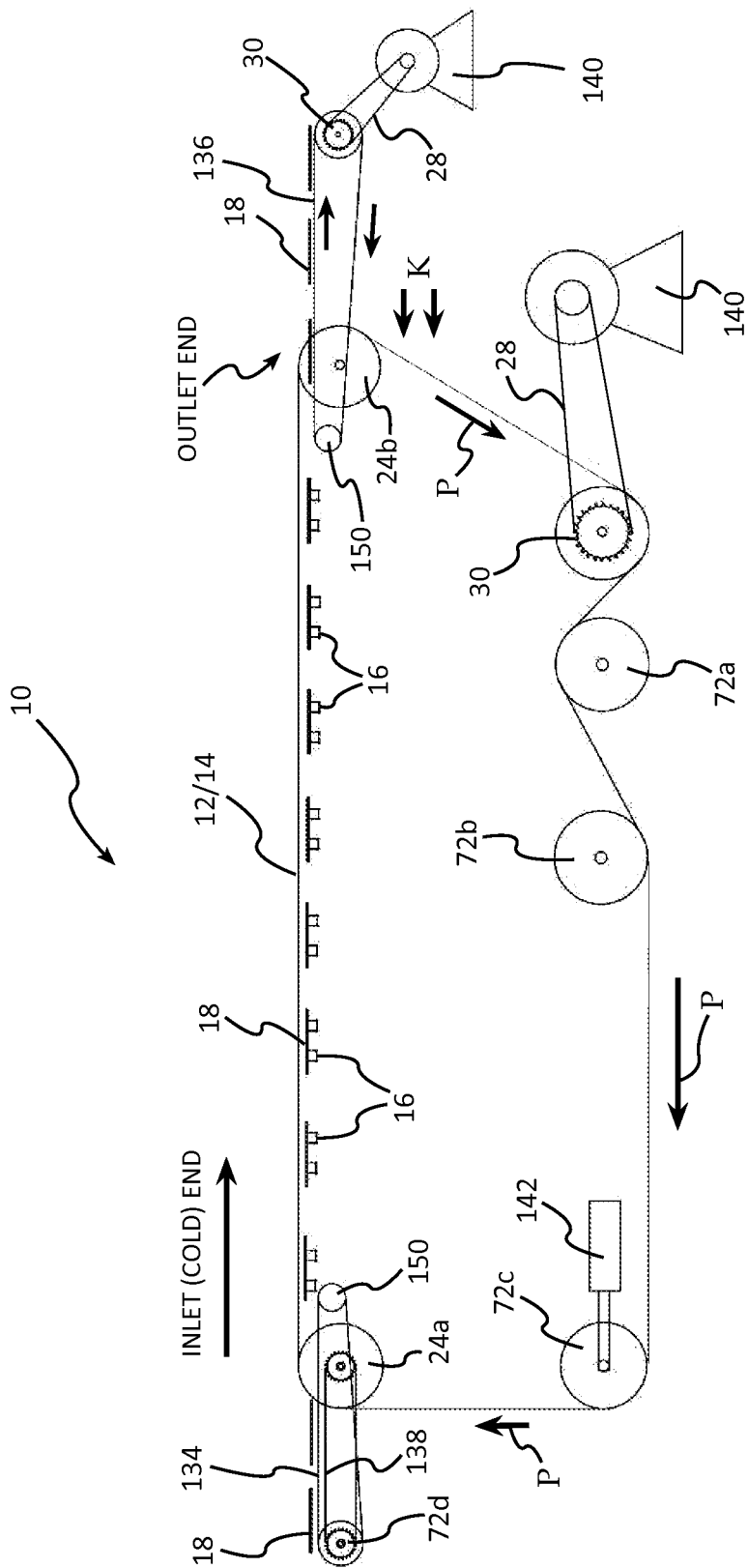
FIG. 15 is a schematic in side elevation of the transition geometry between the transfer conveyors and the main furnace finger drive transport system.

FIG. 15 shows the drive path P of an exemplary main wafer transport system 10 employing a finger drive assembly as described above interfacing with wafer input transfer conveyor belt 134 and the finished (doped or fired) wafer output transfer conveyor belt 136. Because the inventive finger drive transport system 10 comprises two drive chains with an open gap S between them (FIG. 2), the transfer conveyors 134, 136 overlap the inlet and outlet ends, respectively, of the furnace conveyor 10 for smooth hand-off of the wafers (as shown in more detail in FIGS. 16 and 17 below).

The two transfer belts 134, 136 are, for example, woven wire mesh belts that are narrower than the width of the wafer 18 being transported so that both side edges are free to be engaged by the fingers 16 as they rise from below the wafer. The input transfer conveyor is slaved off the input transport sprocket 24 of the furnace transport 10 by belt(s) 138. The output transfer conveyor 136 is driven by motor 140 through drive chain or belt 28 engaging drive sprocket 30. For clarity, FIG. 15 shows the wafers 18 travel in a horizontal path generally level with or below the transport chain (as shown), as a result of the downward slant of the intermediate section 36 of fingers 16 (FIGS. 2 & 10). They can be elevated, for example as in the band conveyance members shown in FIG. 6.

The path of the furnace transport system 10 is shown as a continuous loop of the side wafer conveyance members 12/14. Starting at the left transport sprocket 24a, the band or chain (76, 90 FIGS. 1, 6 and 7A) traverses through the several zones of the furnace to the right, output transport sprocket 24b. On the return path, the conveyance members 12/14 descend below the work-piece (wafer) transport processing path to be engaged by drive sprocket 30 driven by motor 140 via drive chain 28. The chain or band conveyance members 12/14 then pass over idler sprocket 72a, over idler sprocket 72b and under tensioner sprocket 72c. The sprocket 72c changes the direction of chains 12/14 upwardly back to the inlet sprocket 24a, completing the loop. Sprocket 72c is connected to tensioner assembly 142, e.g. comprising a hydraulic cylinder or linear actuator, to maintain proper tension on the transport chains 12/14.

Note that the tensioner assembly 142 is located at the cold end of the conveyance member loop. The drive motor 140 is located below the output end of the furnace so that the conveyance chains 12/14 are pulled through the furnace. The mass of the conveyance means 12/14 is so low, being for example, bands 76 or chains 90, that they export minimal heat energy out of the furnace and cool very quickly. If additional cooling of the chains or bands 12/14 is needed, it may be provided at location K, e.g., in the form of ambient or chilled air blowers, as shown by the arrows.

Figure 16:
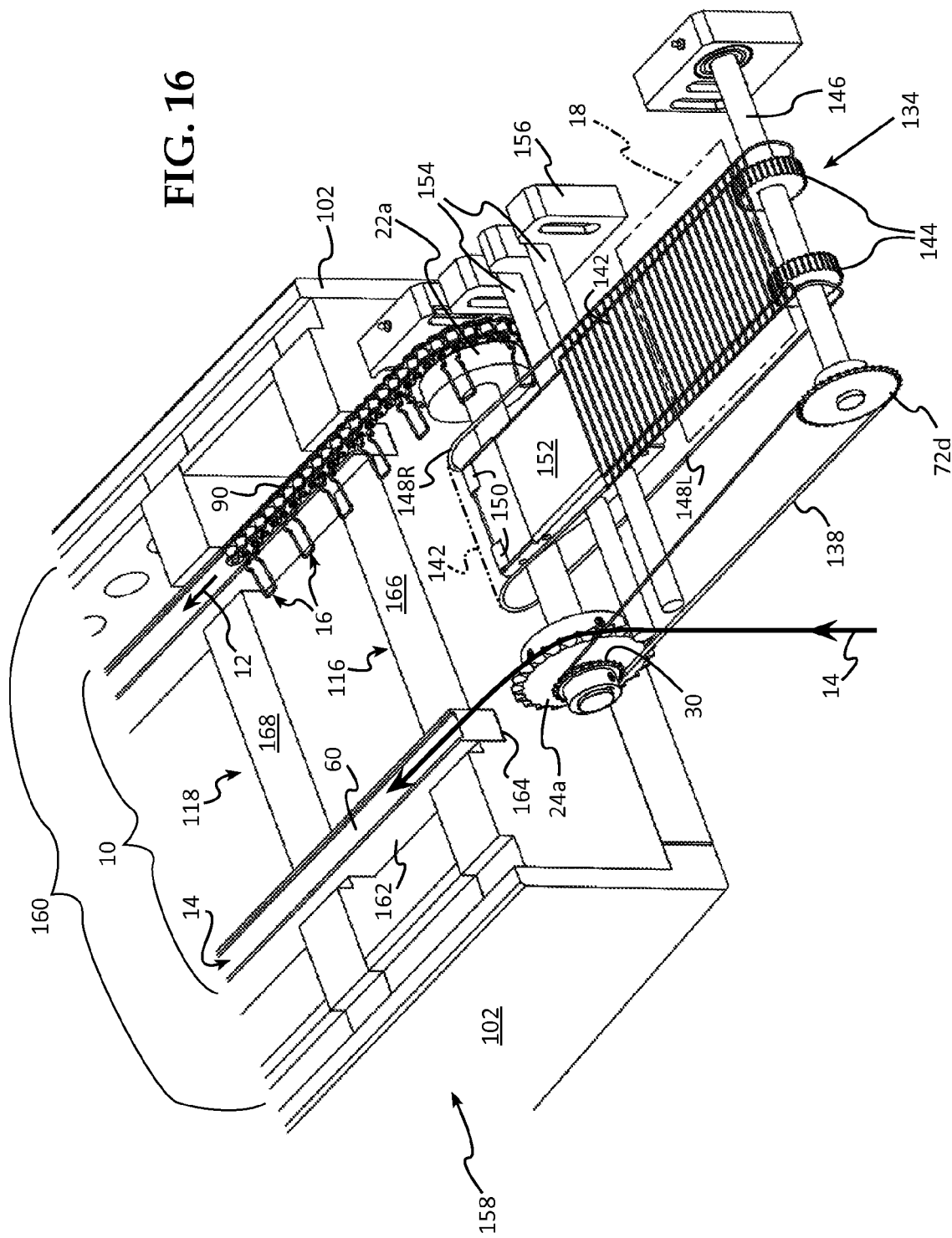
FIG. 16 is an isometric view of the hand-off of wafers from an in-feed or output transfer conveyor and the main furnace finger drive transport system.

FIG. 16 shows in more detail the lift-from-below method of hand-off from the narrow wire mesh transfer conveyor 134 to the main furnace wafer conveyance finger drive chains 12/14, in this figure comprising the chain fingers 16 mounted on drive chains 90, only the right chain member 12 being shown so as to not obscure detail, the path of the left chain 14 being shown schematically as a line. Wafer 18, shown in phantom, is supported by the open wire mesh 142 of transfer conveyor 134, with the wafer margins overhanging free on each side. In the example shown, the wafer is 6" wide and conveyor transport mesh is 4" wide, so that a 1" strip of wafer is free on each side. The transfer conveyor 134 is slaved to the furnace transport drive via drive sprocket 30 mounted on the same shaft as entry transport sprockets 22a and 24a, through chain 138 driving sprocket 72d. The wire mesh 142 is engaged by grooved rollers 144 mounted on shaft 146 at the inlet end of the transfer conveyor 134.

The outline of the sides of the wire mesh 142 is shown as 148L and 148R. As shown, the outlet end of the transfer conveyor mesh 142 is shown as a dash-dot-dash line. The mesh at the outlet end passes over and is redirected back by a pair of rollers 150 mounted in guide assembly 152, which in turn is supported by rods 154 journaled at each lateral end in spacer block(s) 156 (only the right block being shown).

As seen in FIG. 16 the inner, output (or nose) end 150 of transfer conveyor 134 extends longitudinally inwardly of the path of the main finger drive wafer conveyance members 12/14. This is possible because the inventive transport system 10 does not span across (between) the two side drive conveyance chain members 12/14; that is it is narrower than the gap S. Thus, the transfer conveyor 134 can present the forward and side margins of the wafer(s) 18 into the path of the rising fingers 16 of side chains 90, where they are gently lifted off the transfer conveyor.

The FIG. 16 also shows an important retrofit aspect of the invention. As shown, furnace 158 has an original processing zone width 160. The original wire mesh conveyor and its support tubes or rods (not shown) of the type shown in U.S. Pat. No. 6,501,051 and U.S. Pat. No. 7,514,650, have been removed. Longitudinal chain guide blocks 162 have been inserted in notches 164 in the end wall 166 and furnace zone divider walls 168. They support slider plates 60 on which chains 90 slide. Thus, the inventive, substantially zero mass, finger transport system can be retrofit in currently installed high mass wire conveyor/tube support, or solid roller-type conveyor furnaces.

FIG. 17 shows in partial side elevation the hand-off of wafers 18, being transported left to right on the input conveyor 134, to the finger drive transport system 10. The wafer 18a is transported horizontally on the open wire mesh belt of the conveyor 134, the nose of which, defined by rollers 150 projects into the path P of the finger chain 90 advancing around the transport sprocket 24a. As the fingers approach from underneath the free edge strips of the wafer 18b, they gently engage and lift the wafer off the input conveyor belt 142 in a substantially horizontal orientation. The wafers 18c, being engaged along opposed edges by a plurality of fingers of chain 90 are then conveyed through the doper or furnace. The transfer of wafers to and from the finger drive transport system 10 is tuned by both the longitudinal adjustment (compare FIGS. 15 and 17), and by vertical adjustment of the guide assembly 152, e.g., by raising or lowering the support rods 154 as shown by adjustment means arrows 155. Thus, the height and longitudinal position of the transfer conveyors 134 (at both ends of the main finger drive) can be finely tuned (adjusted) relative to the plane of the travel of wafers 18 resting on fingers 16 of the chains 12/14 so that the transfer hand-off does not cause shock, cracks or other damage to the wafers during transfer. Optionally, the height of main finger drive may be adjusted by vertical raising or lowering of the jack shaft 26 as shown by arrow 101. One of skill in the art will appreciate that it is a straightforward engineering exercise to implement an adjustment mechanism by a wide range of devices, such as manual adjustment screws engaging threaded vertical bores in the support rods 154, or mechanical or hydraulic jacks.

On review of FIGS. 15-17 and the accompanying text of this Specification, one skilled in the art will understand that it is a straight-forward engineering task to employ the input transfer conveyor system 134 at the output end of the inventive furnace finger drive 10 as an output transfer conveyor 136, by orienting it as a minor image, with the mesh belt running in a direction opposite that shown in FIGS. 16 and 17, that is, around the nose end rollers 150 from below and thence across the top of guide 152. In this output transfer, the chain is driven by a separate motor as shown in FIG. 15.

It should be understood that the nose 150 of the transfer conveyors 134 and 136 as shown in FIGS. 15-17 may project any functionally suitable distance into the path of the main finger drive transport system 10/12/14. For example, the guide assembly 152 of the input conveyor 134 may be positioned so that it is to the right of shaft 26 as shown in FIG. 15. Conversely, for the output conveyor 136, the nose 150 of its guide assembly is to the left of the shaft of sprocket 24b at the output end of the furnace. In this embodiment, the conveyor belts (142 in FIGS. 16 and 17) of the transfer conveyors pass under the shafts of the respective sprockets 24a and 24b on their return paths as seen in FIG. 15. This positioning of the transfer conveyor assembly 134 provides smooth, gentle transfer of thin wafer work-pieces, such as silicon photovoltaic cell wafers, as the fingers rise under both free sides of the full length of the wafers 18 while they are fully supported by the conveyor 134, and lift them more nearly horizontally onto main drive 10. Thus, the transfer at each end of the main drive is a "lift" onto or "lower" off of the main drive, rather than as in current wire mesh furnace main drives which catch the fragile leading edge of the wafers and pull them onto, or push them off of, the main drive. That conventional transfer action results in a substantial amount of wafer breakage, a problem that is overcome by the lift transfer system implemented by the co-operative arrangement of the transfer and main drives relative to each other of the present invention.

Conversely, at the output end of the furnace, the wafers are gently lowered onto the conveyor 136. In addition, the transfer conveyor vertical and horizontal positioning provides another advantage at the output end of the furnace. During processing, wafers tend to warp, becoming bowed upwardly in the center across the lateral width of the wafers. Thus, in conventional wire mesh furnace conveyors, the wafers are resting on their edges, concave down. The conventional transfer conveyor mesh grabs the right and left corners of the bowed-down wafer leading edge. These corners can engage the mesh of the output transfer conveyor and be crushed or cracked-off as the main conveyor belt pushes them onto the transfer conveyor. This problem is eliminated by the present invention, as the fingers of the main drive transport system supports the bowed wafers at point contacts along their edges, and gently lowers them onto the output transfer conveyor. Since the output transfer conveyor is narrower than the wafers, the bowed edges and corners are free, and do not contact the output conveyor belt, hence there is substantially reduced breakage in the transfer conveyor systems of the invention.

Figure 18A:
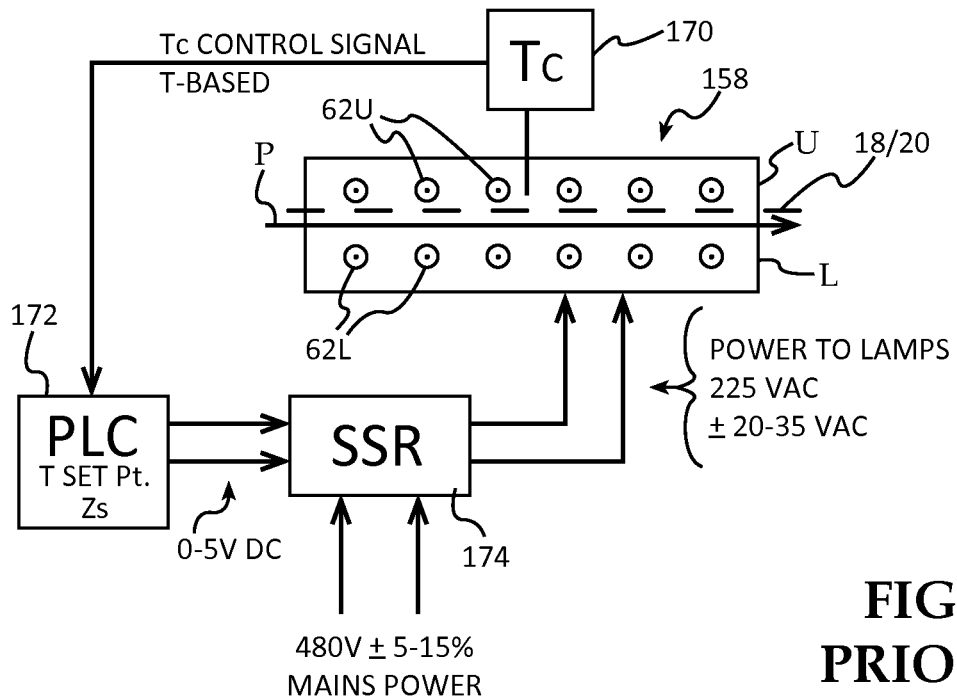
FIGS. 18A and 18B are schematic block diagrams of the architecture of current, showing in FIG. 18A Prior Art a typical commercially available, thermocouple-controlled furnace temperature systems, while FIG. 18B The Invention comparatively shows the inventive transducer-based lamp-voltage control system of this application.
Figure 18B:
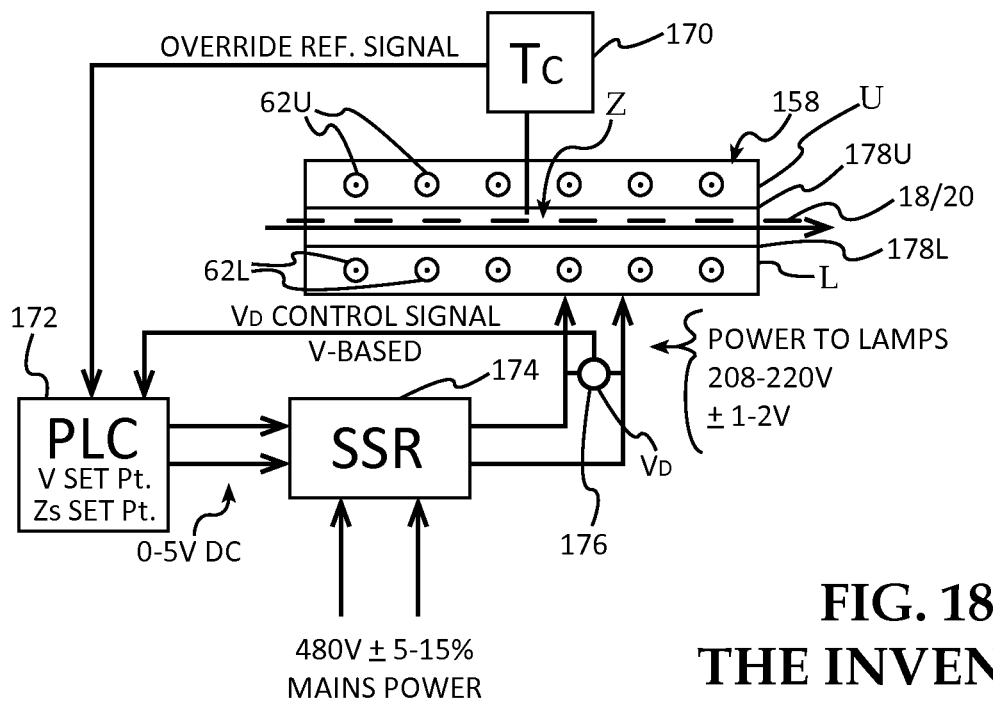

FIGS. 18A and 18B are schematic block diagrams illustrating in FIG. 18A, Prior Art, the architecture of current, commercially-available thermocouple-controlled furnace temperature systems, while FIG. 18B, The Invention, comparatively shows the inventive transducer-based lamp-voltage control system of this application.

FIG. 18A shows a furnace peak firing zone 158, having (in this example) six IR heating lamps 62U in the upper portion of the heating zone, U, and six IR lamps 62L, in the lower portion, L. The path of the conveyor belt, in the prior art a wire mesh belt or solid ceramic roller conveyor, is identified as P, with a plurality of wafers 18/20 being transported through the zone. A thermocouple Tc, 170, sends a Temperature-based control signal (commonly a K-type in milli-volts) to Programmable Logic Controller (PLC), 172, having a Temperature set point, Zs, for the zone to which the thermocouple 170 is dedicated. Depending on the set point Temperature selected and programmed into the PLC, it outputs, typically, 0-5 V DC, the voltage value representing the temperature set point, to a Solid State Relay (SSR), 174. In turn, the SSR controls the power to the lamps from Mains Power 380/480 V input, which varies from about 5% (US) to 15% or more (in foreign countries), that is, on the order of 25-75 or more volts. Since SSR's are controlled as a ratio of the input voltage, the result of the Mains voltage fluctuation is that the power to the lamps also fluctuates proportionally, on the order of 20-35 volts. As a result, the lamp radiant flux output varies significantly, resulting in radiant wavelength changes which adversely affect the ultimate solar cell performance. The adverse effect of radiant wavelength changes is discussed in more detail in our co-pending U.S. Ser. No. 12/761,632, now U.S. Pat. No. 8,039,289. In addition, lamp voltage fluctuations result in IR radiant flux-induced temperature variations of the wafer surface. Since the thermocouple response is relatively slow, on the order of several seconds, many wafers can be processed through the zone when the temperature is too cold or hot due to lamp voltage fluctuations. In the case of the former, too cold, the Ag paste collector grid lines do not burn through the ARC coating so the wafers have low or no output. In the case of the furnace being too hot, the grid lines burn through ARC and the n-p layer, shorting the wafer. The yield is seriously affected, since production is not simply through-put of wafers per hour, but rather is the total number of wafers produced per hour or shift that have an acceptable, standard level of photovoltaic performance.

In the inventive temperature control system, shown in FIG. 18B, there is a similar set-up, with additional elements and functionalities, including the thermocouple 170 output signal $T_C$ (commonly K-type in millivolts) used as a start-up control, followed during operation by transducer-based control, $T_D$, with the $T_C$ signal used only as a fail-safe or override control signal if the temperature in the zone varies by an operator selected amount, say 5-10° C. That is, the furnace start-up heating prior to wafer transfer is controlled by the thermocouple signal $T_C$ until the furnace temperature is stable (within operator-selected parameters, e.g., ±2-5° C.). Upon starting wafer input and during production operation, the PLC's onboard PID (Proportional Integral Derivative) control algorithm switches to transducer-sensed voltage control, $T_D$. The transducer, 176 continuously monitors the voltage provided by SSR 174, and provides an output control signal $T_D$ in the range of from about 0 to about 5 Volts DC (proportional to 0 to 500 VAC) to the PLC. This control signal $T_D$ is wholly lamp-voltage-based, as a baseline has been established for the lamps in the zone, relating lamp power to temperature produced by the lamps in the zone during startup. In addition, the transducer output is rapid response, on the order of milliseconds, to the PLC as voltage from the SSR to the lamps varies. This permits the PLC to control the SSR lamp voltage output to the set point voltage needed for the programmed, pre-selected temperature on a real-time basis. Indeed, the PID is programmed for voltage setting(s) during operation, not temperature settings, since constant voltage to the lamps will result in the temperature needed on the surface of the wafer, in this example the peak firing zone wafer surface temperature of 875-975° C.±1-2° C. Since the conversion to voltage control $T_D$ results in the temperature not being directly controlled, the PLC also periodically monitors the actual zone temperature via $T_C$ signals from the thermocouple 170 to insure that outside influences do not cause long-term temperature shifts. If such deviation beyond configured limits occur, the PLC is programmed to return to $T_C$ control to re-establish zone set-point temperature $Z_S$.

Thus, the temperature in the zone Z of furnace 158 is maintained within processing tolerances, e.g., a goal of ±1-2° C., in the firing zone by the inventive transducer-controlled lamp voltage system, even where Mains power varies widely, e.g. up to 15% or more, since the transducer continuously senses voltage fluctuations, sends control signals to the PLC, which in turn signals the SSR to increase or decrease the output voltage to the lamps, essentially instantaneously. The result is precise lamp spectral output and temperature control in the peak firing zone. This is extremely important for two reasons: First, rapid fluctuations in lamp output causes rapid changes in wafer temperature due to the IR wavelength radiant flux changing. Indeed, rapid fluctuations in lamp output affect the furnace zone temperature less than the wafer surface temperature, and it is the latter that is critical for quality, across the wafer, and consistent, wafer-to-wafer, diffusion and metallization. Second, the inventive finger drive transport system is able to transport wafers at much faster rates, on the order of 300-400+ inches/minute, compared to the top rate of approximately 225 inches/minute with conventional, currently available wire mesh transport conveyor systems. As a result, the dwell time in the peak firing zone using the inventive transport system is in the range of 1-3 seconds, and the throughput of wafers is significantly increased. Due to the high throughput, it is essential to maintain the selected lamp power and spectral output as well as wafer surface temperature as steady as possible to insure all wafers passing through the zone receive exactly the same amount of energy.

Further, as is evident from a consideration of FIG. 18A, lamp output fluctuations are caused by the PLC temperature-based routine itself. As the load changes in the furnace, the resulting change in thermocouple signal input to the PLC results in fluctuating lamp output in an effort to hold the zone temperature constant, but this leaves some wafers receiving less radiant energy and some receiving more because lamp output is the major wafer heating factor. By going to voltage control as in FIG. 18B, the lamps operate at a steady spectral and power output, and adjustments to the lamp output only occur when absolutely necessary if the zone temperature wanders off the $Z_S$ set-point. The elimination of the effect of Main power variations is an additional benefit of the inventive transducer-controlled lamp-voltage system. Since Mains voltage transients last on the order of minutes and thermocouple-only controls are slow-response, the inventive fast response transducer control system results in more consistent yields.

In addition, in the inventive control system shown in FIG. 18B, a pair of IR transmissive plates or "windows" are preferably employed in the peak firing zone 158, an upper zone window 178U and a lower zone window 178L, to assist in maintaining uniformity of temperature in the processing zone between the plates. These plates may be made of quartz, or any high temperature glass such as Robax, Vicor or Pyrex having the ability to remain dimensionally stable at the wafer firing operating temperature. The upper plate 178U is disposed between the wafers 18/20 traversing the process path P by means of the inventive finger drive transport system 10 (that is above the wafers), and below the lamps 62U. The lower plate 178L is disposed between the bottom of the wafers 18/20 and the lower lamps 62L. In this embodiment, the upper plate 178U is spaced well below the lamps, e.g., on the order of ½-2", and the space between the upper plate and upper lamps need not, but may, be air cooled, the latter where an isolation lamp peak firing zone module, employing a flush-mounted quartz window, is used; see our U.S. Pat. No. 7,805,064. In the inventive system, the wafer processing zone, Z, is defined between the upper and lower quartz windows 178U and 178L, respectively. Note that the thermocouple is disposed in the wafer processing zone, Z, so that temperature sensed is the temperature at the wafer, and does not include thermal contribution from any conveyor mesh or rollers, as there are none.

Figure 19:
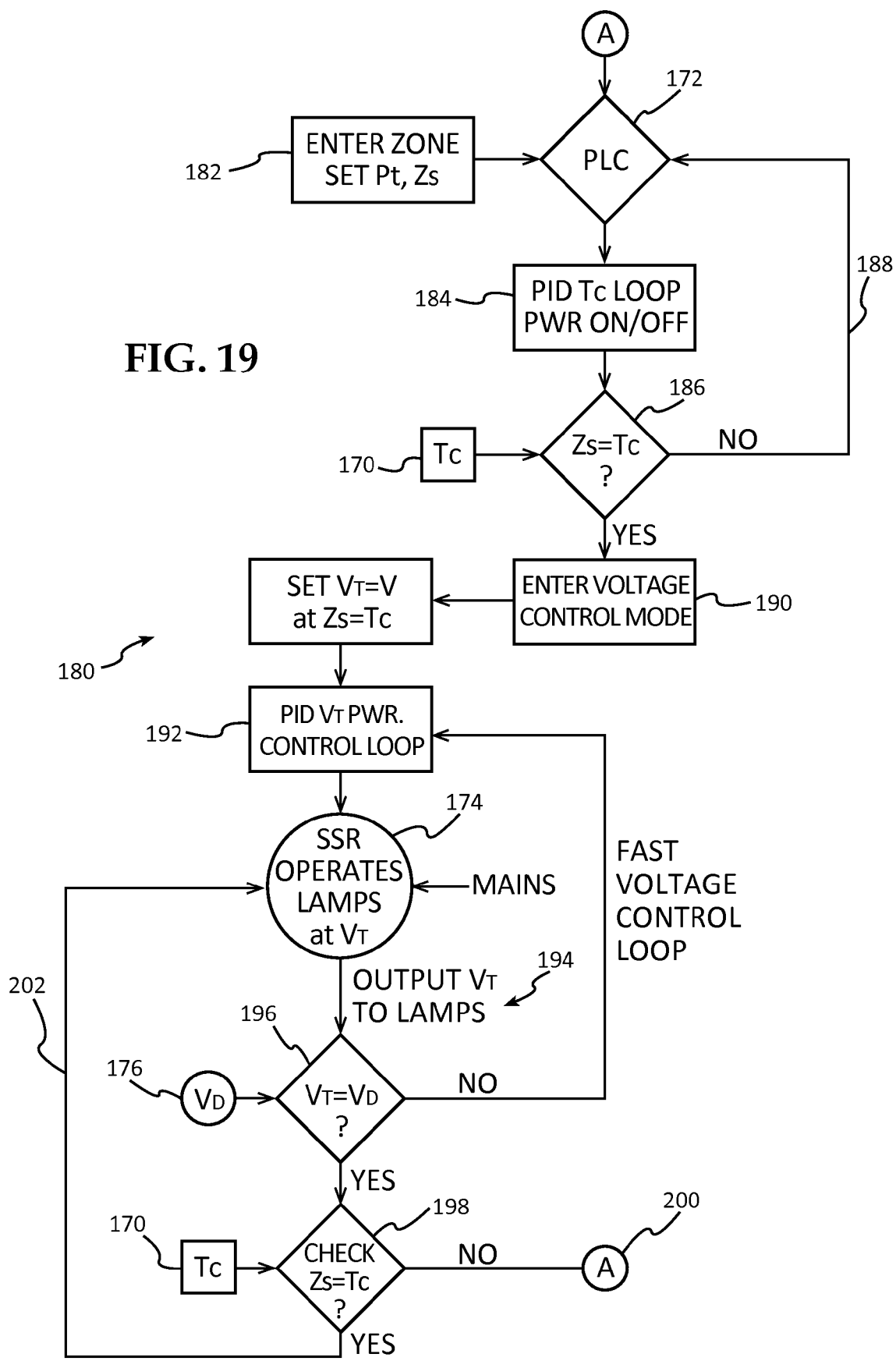
FIG. 19 is a flow sheet schematic that graphically illustrates the furnace start-up and work-piece processing algorithm of the inventive transducer-based lamp-voltage control system of this application.

The FIG. 19 shows, in flow sheet schematic form, the furnace start-up and work-piece processing algorithm of the inventive transducer-based lamp-voltage control system 180 shown in FIG. 18B. In step 182, the selected process (firing) zone Z set point $Z_S$ is entered in the PLC 172 via the process configuration screen. Then, to initiate furnace warm-up to operating temperature, the PLC's resident PID control loop 184 operates off signal input from thermocouple 170, $T_C$ to power ON the lamps via the SSR 174. The algorithm checks in step 186 the thermocouple reading $T_C$ against the set point $Z_S$. If the furnace has not reached operating temperature $Z_S$ as yet, the power is continued to lamps, to continue heating, via loop 188. When the furnace zone Z reaches set point $Z_S$, the PLC takes a snapshot of the voltage V at the moment the furnace zone reaches the set point $Z_S$, and automatically switches over to the Voltage Control Mode 190, using that voltage V as the set point $V_T$ for lamp voltage control 192. The PLC then controls the SSR 174 to adjust the Mains voltage to output voltage $V_T$ 194 to the lamps 62U and 62L in furnace 158. The transducer 176 monitors the voltage to the lamps $V_D$, as an input to the PLC. The algorithm compares if $V_T=V_D$,

196. If NO, voltage to the lamps has wandered off the set point $V_T$, the fast voltage control loop sends a signal back to the PLC to re-adjust the SSR voltage to the lamps. If the voltage $V_T=V_D$, there is a selected periodic check 198, built into the algorithm, by the PLC of the actual temperature in zone Z by comparison of a signal $T_C$ from the thermocouple to the set point $Z_S$ value. If NO, $Z_S \neq T_C$, there is an override 200 back to $T_C$ control, A to A in the figure. If YES, the momentary $T_C$ input=$Z_S$, the continuity loop 202 continues operation of lamp voltage $V_T$ to the lamps.

The inventive transducer-controlled lamp-voltage system provides rapid response to lamp voltage fluctuations, keeping spectral output at optimum, while verifying the actual temperature of the wafer surface in the zone, Z, by periodic cross check and override by the PID $T_C$ control loop. Where the temperature in the zone, Z, sensed by thermocouple 170 is too hot, the override signal 198 back to $T_C$ control 184 causes power to the lamps to be gradually reduced in a programmed manner to bring the zone temperature back to the set point $Z_S$, after which the voltage control mode is re-entered. The reverse applies in the case where $T_C$ senses the zone is too cold, which initiates a gradual increase in lamp power to set point $Z_S$.

INDUSTRIAL APPLICABILITY

It is clear that the inventive finger drive system and methods of this application have wide applicability to the wafer processing industry, namely transport of silicon wafers through the various steps of converting the wafers to solar PV cells. The system clearly provides manufacturing cost reduction and improved speed of process and throughput by virtue of being essentially mass-less, and eliminating bottom shadowing of the wafer surface during processing. The wafers appear to float through the processing system, riding on a magic carpet. Thus, the inventive shadow-less, mass-less drive system has the clear potential of becoming adopted as the new standard for apparatus and methods of wafer transport. The individually configurable thermal profile on a lane-by-lane, zone-by-zone, upper and lower furnace zone halves provide a wide range of processing flexibility unmatched by other furnaces. The transducer controlled lamp voltage system and method provides the critically required precise control of furnace temperature, even where mains voltage varies frequently and often widely, more than 10%.

It should be understood that various modifications within the scope of this invention can be made by one of ordinary skill in the art without departing from the spirit thereof and without undue experimentation. For example, the inventive fingers can have a wide range of designs to provide the functionalities disclosed herein. It is clear that the inventive finger drive may be applied to any work-piece handling in which minimum contact with the work-piece is needed during transport, so as not to interfere with the surface(s) of the work-piece being treated. In the alternative to IR lamp heating, resistive radiant SiC rods or coiled heating elements may be used, preferably sheathed in protective re-radiant ceramic tubes. Likewise, the inventive transducer-controlled lamp voltage system can be adapted for use with a conventional conveyor system employing wire mesh or roller-type conveyor systems. This invention is therefore to be defined by the scope of the appended claims as broadly as the prior art will permit, and in view of the specification if need be, including a full range of current and future equivalents thereof.

Parts List (This Parts List is provided as an aid to Examination and may be canceled upon allowance)

| | |
|---|---|
| 10 Inventive Finger Drive Transport System | 82 Holes in drive bands to receive the drive pins |
| 12 Right wafer conveyance member of chain drive system | 84 Ears on pylon side flanges |
| 14 Left wafer conveyance member of chain drive system | 86 Holes in ears to receive shank 32 of fingers 16 |
| 16 Fingers | 88 Tail stop member |
| 18 Large wafer | 90 Roller chain(s) |
| 20 Small Wafer | 92 Pivot tubes of chain links |
| 22 Right transport sprocket | 94 Chain rollers |
| 24 Left transport sprocket | 96 Spacer washer |
| 26 Common drive shaft | 98 Spacer collar |
| 28 Drive chain or belt | 100 Bearing blocks for drive shaft |
| 30 Drive sprocket | 102 Furnace, dryer, doper, UV pre-treater frame side rails |
| 32 Finger shank | 104 Double, opposite pointing, finger center chain |
| 34 Knuckle stop | 106 Second center chain with oppositely pointing fingers |
| 36 Support section "digit" | 108 Third center chain, like 106 |
| 38 Tip of finger | 110 Lamp filament, strait |
| 40 Leading edge of wafer | 112 Heavier/coiled filament segment or higher powered |
| 42 Trailing edge of wafer | 114 Portion of exemplary furnace |
| 44 Right side edge of wafer | 116 Entry Baffle Zone |
| 46 Left side edge of wafer | 118 A first heating zone |
| 48 Top of wafer | 120 A subsequent heating zone |
| 50 Bottom of wafer | 122 Center longitudinal wall supporting 1 or 2 sliders 60C |
| 52 D-type chain link | 124 Double finger cross-bar |
| 54 Finger overlap, large wafer | 126 Sleeve for finger shank |
| 56 Finger overlap, smaller wafer | 128 Cotter-type pin |
| 58 Ceramic/silicon carbide/zirconia/glass or quartz sleeve | 130 Inner chain links |
| 60 Slider bar | 132 Outer chain links |
| 62 IR lamp(s) array, 62U upper, 62L lower | 134 Wafer Input transfer belt |
| 64 Intermediate segment of finger (optional) | Lane R, Right lane of dual lane furnace, dryer or doper |
| 66 Protective sleeve | Lane L, Left lane of dual lane furnace, dryer or doper |
| 68a, b Bi-conical form of sleeve member 66 | A, A-1, A-2 = Direction of wafer travel in process zone(s) |
| 70 Rib | B = Weld    K = Cooling applied to chains |
| 72 Idler sprockets (may be driven) | C = Weld    S = Gap between side chains |
| 74 Idler shaft (may be driven) | D = Point Contact of wafer edge with finger |
| 76 Drive bands | E = Direction of transport chain return to entry |
| 78 Pylons, U-shaped in horizontal X-section | F = Weld    P = Path of chain drive |
| 80 Pins in drive wheels 22, 24 | G = Weld    Z = Process zone between quartz plates |
| 136 Wafer Output transfer belt | |
| 138 Transfer conveyor drive chain | 101 Adjustment means of finger drive shaft 26/block 100 |

Parts List (This Parts List is provided as an aid to Examination and may be canceled upon allowance)

140 Drive motor
142 Transfer conveyor open wire mesh
144 Grooved rollers to drive wire mesh of Xfer conveyor
146 Shaft
148L, 148R outline of conveyor mesh
150 Rollers at nose of Guide Assy for Xfer conveyor
152 Guide Assy of Xfer Conveyor
154 Support rods for guide assy         155 Vertical Adjustability means
156 Spacer blocks
158 Furnace
160 Original width of furnace conveyor
162 Longitudinal guide blocks
164 Notches in transverse furnace walls
166 Furnace entry end wall
168 Furnace interior zones divider walls
170 Thermocouple
172 PLC/PID
174 SCR
176 Transducer
178U, 178L Quartz Plates
180 Transducer-based lamp voltage control system
182 Enter Set Point Zs of zone Z
184 PID controller and algorithm
186 Check Zs = Tc?
188 Continue-Heating Loop
190 YES = Enter Voltage Control Mode
192 Lamp voltage control set point $V_T$
194 SSR adjusts Mains to $V_T$ output
196 Compare $V_T$ to $V_D$
198 Check Tc to Zs
200 Override loop back to Tc-only Temp Control
202 Continuity loop

The invention claimed is:

1. A transport system for continuously conveying work-pieces having side edges and a top and a bottom surface, in a processing path along a longitudinal center line through at least one horizontal processing zone, comprising in operative combination:
   a) a first and a second separate, longitudinally movable, laterally spaced-apart, parallel work-piece conveyance member, together constituting a pair of conveyance members defining a processing lane between them, each of said conveyance members being supported adjacent a side of said processing zone to move horizontally through said processing zone along said processing path while supporting a plurality of work-pieces;
   b) a drive system for synchronously driving both said first and second conveyance members comprising said lane pair, at the same rate through said processing zone, said conveyance members and said drive system together comprising a continuous conveyor that continuously conveys said work-pieces through said processing zone;
   c) each of said conveyance members of said pair are fitted with fingers spaced longitudinally apart, said fingers project laterally toward said processing path longitudinal center line but terminate short of said centerline to provide an open area between said conveyance fingers the width of which is a gap; and
   d) said work-pieces are engaged by a plurality of said fingers, each in essentially point contact, along side marginal edges thereof to provide simultaneous unobstructed processing access in said open area to said top and bottom surfaces of said work-pieces, while said work-pieces are transported along said processing path lane in said zone, thereby providing a substantially shadow-less and mass-less, work-piece continuous transport system.

2. A transport system as in claim 1 wherein said conveyance members are selected from wire D-link type chains, bands and roller chains.

3. A transport system as in claim 1 wherein said fingers engage said work-pieces by at least one of support along a bottom marginal edge of said work-piece and suspension from above.

4. A transport system as in claim 1 wherein said fingers are selected from at least one of single finger configuration, double finger configuration, and fingers configured to transport silicon wafer work-pieces, said double finger configuration including a longitudinally oriented cross-piece spanning between an adjacent pair of parallel fingers.

5. A transport system as in claim 4 wherein said fingers are selected from at least one of high temperature resistant wire, passivated wire, and wire having a protective sheath member.

6. A transport system as in claim 5 wherein said protective sheath is selected from at least one of a sleeve of ceramic, glass, quartz or zirconia, and a coating of a ceramic engobe or glass.

7. A transport system as in claim 1 wherein said processing zone includes a work-piece treatment assembly through which said conveyance members pass along said processing path selected from at least one of UV pre-treatment assembly, chemical dopant composition applicator, a diffusion furnace, a dryer and a metallization furnace, each of said treatment assemblies including means providing relative motion of an upper processing zone, defined above the plane of said processing path, and a lower processing zone, defined below the plane of said processing path, to provide access into at least one of said upper zone and said lower zone, said open area gap between said laterally spaced fingers of said conveyance members pair providing access into said lower processing zone when said upper processing zone is raised relative to a fixed lower processing zone.

8. A transport system as in claim 7 wherein said processing zones of said diffusion furnace, said dryer and said metallization furnace are heating zones, said treatment assembly includes a plurality of IR lamps for heating said work-pieces disposed transverse to said processing path, and said IR lamps are positioned in at least one of above said path in said upper heating zone, below said path in said lower heating zone, and in both said upper and said lower heating zones.

9. A transport system as in claim 1 which includes a plurality of processing lanes disposed side-by-side in spaced parallel relationship.

10. A transport system as in claim 9 wherein said drive system is selected from a common drive for multiple lanes and independent drives for at least two of said plurality of lanes.

11. A transport system as in claim 9 which includes at least a pair of lanes in said side-by-side relationship which are driven by a common drive and which includes three conveyance members fitted with laterally projecting fingers, a right outer member for a first lane, a left outer member for a second lane, and a common center member having fingers projecting laterally on both sides thereof to provide a left finger set for said first lane and a right finger set for said second lane.

12. A transport system as in claim 8 wherein said treatment assembly includes a process temperature controller configurable to permit said IR lamps to heat said work-pieces transiting along a processing path lane in a pre-selected temperature profile from an inlet to an outlet of said heating zones.

13. A transport system as in claim 12 wherein said temperature controller includes: a programmable logic control means (PLC) configurable to select a temperature set point, Zs, and a lamp voltage set point, VT, for a selected processing zone; a thermocouple, T, disposed to provide a signal, Tc, representative of the temperature of at least one selected surface of said work-pieces in said processing zone, Z; a solid state relay (SSR) responsive to signals representative of Zs from said PLC for controlling Mains power to said IR lamps sufficient to achieve said temperature set point Zs; and a transducer TD for monitoring voltage actually delivered to said IR lamps from said SSR; said transducer providing to said PLC a transducer-based signal, VD, representative of actual voltage to said IR lamps; said temperature controller is configured for start-up heating of said zone to control said SSR output to said lamps based on said thermocouple-based signal, Tc, then after reaching Zs, entering a transducer-based voltage control of lamp output mode by controlling said SSR based on said signal VD, and if Tc varies from Zs by a pre-selected amount, switching back to said Tc control to gradually bring said zone back to the pre-selected zone temperature set point Zs.

14. A transport system as in claim 1 which includes at least one of an input transfer conveyor feeding work-pieces into an input end of said processing lane and an output transfer removing processed work-pieces from an output end of said processing lane, said transfer conveyor having a width less than said gap and less than the width of said work-pieces so that side edges of said work-pieces project beyond side edges of said transfer conveyor, and one end of said transfer conveyor projects into said gap, so that said fingers can lift work-pieces up from said transfer conveyor at said input end of said processing lane, and place work-pieces onto said transfer conveyor at said output end of said processing lane.

15. A transport system as in claim 14 wherein the end of said transfer conveyor projects into said gap a functionally suitable distance and includes means for vertical adjustment, so as to provide gentle lifting hand-off to, or lowering take-off from, said fingers without damage to said work-pieces.

16. A method of continuous transport of work-pieces having side edges and a top and a bottom surface, in a substantially horizontal, linear processing path lane along a longitudinal center line through at least one horizontal processing zone for carrying out at least one processing operation, comprising the steps of:
  i. engaging said work-piece in a plurality of substantial point contacts along opposed side edges of said work-piece in a manner to provide an open area between said contacts the width of which is a gap;
  ii. continuously moving said work-piece through said processing zone in said processing path while maintaining said side edge contacts; and
  iii. maintaining the top surface of said work-piece unobstructed and said bottom surface substantially unobstructed in said gap for at least one processing operation applied to said work-piece; and
  iv. so that said work-piece is continuously transported through said processing zone with said bottom surface rendered essentially free of conveyor support shadows.

17. A method as in claim 16 wherein said point contacts are provided by fingers projecting laterally from transport means disposed to move in parallel relationship along each side of said linear processing path.

18. A method as in claim 17 wherein said fingers are selected from at least one of single finger and double finger configuration.

19. A method as in claim 17 wherein multiple processing paths are disposed in side-by-side relationship and which includes the additional step of moving said work-pieces on each of said paths in at least one of synchronously and independently.

20. A method as in claim 16 wherein said processing zone includes a work-piece treatment assembly through which said work-pieces are conveyed along said processing path selected from at least one of UV pre-treatment assembly, chemical dopant composition applicator, a diffusion furnace, a dryer and a metallization furnace, each of said treatment assemblies including means providing relative motion of an upper processing zone, defined above the plane of said processing path, and a lower processing zone, defined below the plane of said processing path, to provide access into at least one of said upper zone and said lower zone, said open area gap providing access into said lower processing zone when said upper processing zone is raised relative to a fixed lower processing zone.

21. A method as in claim 20 which includes the added step of heating said work-pieces as they are conveyed along at least a portion of said processing path by exposure to IR radiant flux.

22. A method as in claim 21 wherein said heating step includes the added steps of:
  a) entering a temperature set point, Zs, and a lamp voltage set point, VT, for a selected processing zone in a programmable logic control means (PLC);
  b) providing a signal, Tc, to said PLC from a thermocouple disposed in said processing zone that is representative of the temperature of at least one selected surface of said work-pieces being conveyed through said processing zone, Z;
  c) providing signals from said PLC representative of Zs to a solid state relay (SSR);
  d) controlling Mains power to IR lamps producing said IR radiant flux by said SSR in response to said PLC Zs signals, an amount and for a time sufficient to achieve said temperature set point Zs;

e) monitoring voltage actually delivered to said IR lamps from said SSR by a transducer TD which provides to said PLC a transducer-based signal, VD, representative of actual voltage to said IR lamps;

f) configuring said PLC for start-up heating of said processing zone in response to said thermocouple-based signal Tc until said zone heating by SSR power output to said lamps reaches Zs, whereupon said PLC thereafter controls said SSR lamp voltage output in response to said transducer voltage signal VD;

g) configuring said PLC to switch back to said thermocouple-based Tc control if Tc varies from Zs by a pre-selected amount to gradually bring said processing zone back to the pre-selected zone temperature set point Zs.

23. A method as in claim 20 which includes the added steps of providing at least one work-piece transfer conveyor for feeding work-pieces into an input end of said processing lane and removing processed work-pieces from an output end of said processing lane, said transfer conveyor having a width less than said gap and less than the width of said work-pieces so that side edges of said work-pieces project beyond side edges of said transfer conveyor, and one end of said transfer conveyor projects into said gap a sufficient distance so that said fingers can pick up work-pieces from said transfer conveyor at said input end of said processing lane, and place work-pieces onto said transfer conveyor at said output end of said processing lane.

24. A method as in claim 23 which includes the added steps of adjusting the distance said transfer conveyor projects into said gap, and vertically adjusting the end of said transfer conveyor projecting into said gap, to provide gentle hand-off to, or take-off from, said fingers without damage to said work-pieces.

25. A method as in claim 20 wherein said work-pieces are silicon wafers and said processing operation comprises the step of exposing at least one of a top and a bottom of said wafers to IR radiation flux to heat treat said wafers while said wafers are moving through said zone.

* * * * *